United States Patent
Yang et al.

(10) Patent No.: US 9,142,558 B2
(45) Date of Patent: Sep. 22, 2015

(54) SEMICONDUCTOR DEVICE HAVING SUPPORTER AND METHOD OF FORMING THE SAME

(71) Applicant: SAMSUNG ELECTRONICS CO., LTD., Suwon-si, Gyeonggi-do (KR)

(72) Inventors: Hyun-Jeong Yang, Hwaseong-si (KR); Soon-Wook Jung, Hwaseong-si (KR); Bong-Jin Kuh, Suwon-si (KR); Wan-Don Kim, Yongin-si (KR); Byung-Hong Chung, Hwasung (KR); Yong-Suk Tak, Hwasung (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/066,000

(22) Filed: Oct. 29, 2013

(65) Prior Publication Data
US 2014/0138794 A1    May 22, 2014

(30) Foreign Application Priority Data

Nov. 21, 2012    (KR) .................... 10-2012-0132422

(51) Int. Cl.
*H01L 27/108* (2006.01)
*H01L 49/02* (2006.01)

(52) U.S. Cl.
CPC .......... *H01L 27/10852* (2013.01); *H01L 28/87* (2013.01); *H01L 28/91* (2013.01)

(58) Field of Classification Search
CPC ... H01L 27/10852; H01L 28/87; H01L 28/91; H01L 28/60; H01L 28/40
See application file for complete search history.

(56) References Cited

U.S. PATENT DOCUMENTS

| | | | |
|---|---|---|---|
| 5,792,593 A * | 8/1998 | McClure et al. ............... | 430/314 |
| 6,060,406 A * | 5/2000 | Alers et al. .................... | 438/785 |
| 6,667,502 B1 | 12/2003 | Agarwal et al. | |
| 7,064,028 B2 | 6/2006 | Ito et al. | |
| 7,871,891 B2 | 1/2011 | Cho et al. | |
| 2003/0227043 A1* | 12/2003 | Kutsunai ....................... | 257/299 |
| 2005/0167725 A1* | 8/2005 | Nagano et al. ................ | 257/309 |
| 2009/0014833 A1 | 1/2009 | Yoon et al. | |
| 2009/0102017 A1 | 4/2009 | Bae et al. | |
| 2011/0115051 A1 | 5/2011 | Kim et al. | |

FOREIGN PATENT DOCUMENTS

| KR | 10-2004-0059783 A | 7/2004 |
|---|---|---|
| KR | 10-2008-0065123 A | 7/2008 |
| KR | 10-2008-0084391 A | 9/2008 |
| KR | 10-0890049 B1 | 3/2009 |
| KR | 10-2009-0068774 A | 6/2009 |
| KR | 10-2009-0068776 A | 6/2009 |
| KR | 10-2009-0110692 A | 10/2009 |
| KR | 10-2010-0051344 A | 5/2010 |
| KR | 10-2011-0060749 A | 6/2011 |
| KR | 10-2011-0073097 A | 6/2011 |

* cited by examiner

*Primary Examiner* — Tucker Wright
(74) *Attorney, Agent, or Firm* — Lee & Morse, P.C.

(57) ABSTRACT

A semiconductor device includes a plurality of lower electrodes having a vertical length greater than a horizontal width on a substrate, a supporter disposed between the lower electrodes, an upper electrode disposed on the lower electrodes, and a capacitor dielectric layer disposed between the lower electrodes and the upper electrode. The supporter includes a first element, a second element, and oxygen, an oxide of the second element has a higher band gap energy than an oxide of the first element, and the content of the second element in the supporter is from about 10 at % to 90 at %.

26 Claims, 28 Drawing Sheets

SEMICONDUCTOR DEVICE HAVING SUPPORTER AND METHOD OF FORMING THE SAME

CROSS-REFERENCE TO RELATED APPLICATION

The present application claims priority under 35 U.S.C. §119 to Korean Patent Application No. 10-2012-0132422, filed on Nov. 21, 2012, in the Korean Intellectual Property Office, and entitled: "Semiconductor Device Having Supporter and Method of Forming the Same," which is incorporated by reference herein in its entirety.

BACKGROUND

1. Field

Embodiments relate to a semiconductor device having one or more supporters, and methods of forming the same.

2. Description of Related Art

Semiconductor devices may include electrodes variously disposed on a substrate. During fabrication of a semiconductor device, certain elements of the device may be deposited, and subsequently removed (e.g., by etching).

SUMMARY

Embodiments are directed to a semiconductor device including a plurality of lower electrodes disposed on a substrate, first and second supporters disposed between the lower electrodes, an upper electrode on the lower electrodes, and a capacitor dielectric layer disposed between the lower electrodes and the upper electrode. The first supporter may include a first element, a second element, and oxygen, an oxide of the first element may have better adhesion to the lower electrodes than the second supporter, and an oxide of the second element may have a higher band gap energy than the oxide of the first element.

The second supporter may include silicon nitride, the first element may include Ta or Ti, and the second element may include Si, Al, Mg, Be, or a combination thereof.

The first supporter may include layers of the oxide of the first element and layers of the oxide of the second element being alternately and repeatedly stacked.

The layers including the oxide of the first element may have a thickness of from about 0.1 nm to 5 nm.

The first supporter may include a layer including both the oxide of the first element and the oxide of the second element.

The first supporter may be in contact with the plurality of lower electrodes, and an upper surface or lower surface of the second supporter.

The first supporter may include an upper supporter in contact with an upper surface of the second supporter, and a lower supporter in contact with a lower surface of the second supporter. The second supporter may have a smaller horizontal width than the upper supporter and the lower supporter, and parts of the lower electrodes may protrude between the upper supporter and the lower supporter.

The first supporter may be formed between the lower electrodes and the second supporter, and may be in contact with the lower electrodes and the second supporter.

The second supporter may have a smaller horizontal width than the first supporter, the first supporter may be in contact with the lower electrodes, and the second supporter may be in contact with the first supporter and spaced apart from the lower electrodes.

Embodiments are also directed to a semiconductor device including lower electrodes having a vertical length greater than a horizontal width on a substrate, a supporter disposed between the lower electrodes, an upper electrode disposed on the lower electrodes, and a capacitor dielectric layer disposed between the lower electrodes and the upper electrode. The supporter may include a first element, a second element, and oxygen, an oxide of the second element may have a higher band gap energy than an oxide of the first element, and the content of the second element in the supporter may be from about 10 at % to 90 at %.

The lower electrodes may include Ru, RuO, or a combination thereof, the first element may be Ta or Ti, and the second element may be Si, Al, Mg, Be, or a combination thereof. The first element may be Ta, the second element may be Si, and the content of the second element in the supporter may be from about 10 at % to 20 at %. In other example embodiments, the first element may be Ta, the second element may be Al, and the content of the second element in the supporter may be from about 20 at % to 40 at %. The oxide of the second element may have a band gap energy of at least about 5.0 eV.

Embodiments are also directed to a semiconductor device that includes a plurality of switching devices disposed on a substrate, an interlayer insulating layer disposed on the switching devices, conductive plugs passing through the interlayer insulating layer and connected to the switching devices, an etch-stop layer disposed on the interlayer insulating layer and the conductive plugs, a plurality of lower electrodes passing through the etch-stop layer and connected to the conductive plugs, and having a vertical length greater than a horizontal width, first and second supporters disposed between the lower electrodes, an upper electrode disposed on the lower electrodes, and a capacitor dielectric layer disposed between the lower electrodes and the upper electrode. The first supporter may include a first element, a second element, and oxygen, an oxide of the first element may have better adhesion to the lower electrodes than the second supporter, and an oxide of the second element may have a higher band gap energy than the oxide of the first element.

The conductive plugs may include W, Ru, TiN, or a combination thereof.

The etch-stop layer may include a first etch-stop layer and a second etch-stop layer. The first etch-stop layer may include the same material layer as the first supporter, and the second etch-stop layer may include the same material layer as the second supporter.

Each of the lower electrodes may include a first lower electrode with a pillar shape, and a second lower electrode with a cylindrical shape formed on the first lower electrode.

Embodiments are also directed to a semiconductor device including a plurality of lower electrodes having a vertical length greater than a horizontal width, first and second supporters disposed between the lower electrodes, an upper electrode disposed on the lower electrodes, and a capacitor dielectric layer disposed between the lower electrodes and the upper electrode, wherein the first supporter includes an amorphous-state metal oxide having better adhesion to the lower electrodes than the second supporter.

The vertical length of the lower electrodes may be from about 0.1 nm to 5 nm. The horizontal width of the lower electrodes may be from about 0.1 nm to 5 nm. In certain instances, both the vertical length and the horizontal width of the lower electrodes may be from about 0.1 nm to 5 nm.

The lower electrodes may include Ru, RuO, or a combination thereof, the amorphous-state metal oxide may include amorphous TaO, and the second supporter may include silicon nitride.

The first supporter may be in contact with an upper surface or lower surface of the second supporter.

The semiconductor may include a third supporter disposed on the second supporter, the second supporter may be formed between the first supporter and the third supporter, and the third supporter may include the same material as the first supporter and have a thickness of from about 0.1 nm to 5 nm.

The second supporter may have a smaller horizontal width than the first supporter and the third supporter, and at least some of the lower electrodes may include a portion that protrudes between the first supporter and the third supporter.

The semiconductor may further include a fourth supporter disposed over the third supporter, and a fifth supporter disposed over the fourth supporter. The fifth supporter may include the same material as the first and third supporters and have a thickness of from about 0.1 nm to 5 nm. The second and fourth supporters may include silicon nitride, silicon oxy-nitride, silicon oxide, aluminum oxide, or a combination thereof. Each of the first supporter, the third supporter, and the fifth supporter may be in contact with the lower electrodes, and the second supporter may be disposed over and contacting the first supporter, the third supporter may be disposed over and contacting the second supporter, the fourth supporter may be disposed over and contacting the third supporter, and the fifth supporter may be disposed over and contacting the fourth supporter.

The first supporter may be formed between the lower electrodes and the second supporter, and may be in contact with the lower electrodes and the second supporter, and have a horizontal width of from about 0.1 nm to 5 nm.

Embodiments are also directed to a semiconductor device including a plurality of lower electrodes disposed on a substrate, an intermediate supporter, first upper supporter, and second upper supporter disposed between the lower electrodes, an upper electrode disposed over the lower electrodes, and a capacitor dielectric layer disposed between the lower electrodes and the upper electrode. The intermediate supporter may be formed at an intermediate level between upper ends and lower ends of the lower electrodes. The first and second upper supporters may be spaced apart from the intermediate supporter, and may be adjacent to the upper ends of the lower electrodes. The intermediate supporter and the first upper supporter may include a first element, a second element, and oxygen. An oxide of the first element may have better adhesion to the lower electrodes than the second upper supporter, and an oxide of the second element may have a higher band gap energy than the oxide of the first element.

Embodiments are also directed to a semiconductor device comprising a plurality of lower electrodes having a vertical length greater than a horizontal width, a supporter formed between the lower electrodes and including an amorphous-state metal oxide, an upper electrode disposed over the lower electrodes, and a capacitor dielectric layer disposed between the lower electrodes and the upper electrode. The supporter may include a first element, a second element, and oxygen, and an oxide of the second element may have a higher band gap energy than an oxide of the first element.

Embodiments are also directed to semiconductor devices including first and second lower electrodes disposed on a substrate, the first and second lower electrodes having an aspect ratio of at least about 10:1, a supporter disposed between and contacting a lateral surface of each of the lower electrodes, an upper electrode disposed over the first and second supporters, over the first and second lower electrodes, and between the first and second electrodes, and a capacitor dielectric layer disposed between the first and second lower electrodes and the upper electrode. The supporter may include an amorphous-state metal oxide, and an element or oxide compound having a band gap energy of at least about 5 eV.

The supporter may be a layer having a thickness of from about 0.1 nm to 5 nm. The amorphous-state metal oxide may remain in an amorphous state upon exposure to temperatures of at least about 950° C., or even at least about 1200° C. The supporter may include a first layer and a second layer, the first layer including the amorphous metal oxide, and the second layer including the element or oxide compound having a band gap of at least about 5 eV. In other embodiments, the semiconductor device may further include a second supporter including one or more of silicon nitride, silicon oxy-nitride, silicon oxide, and aluminum oxide.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
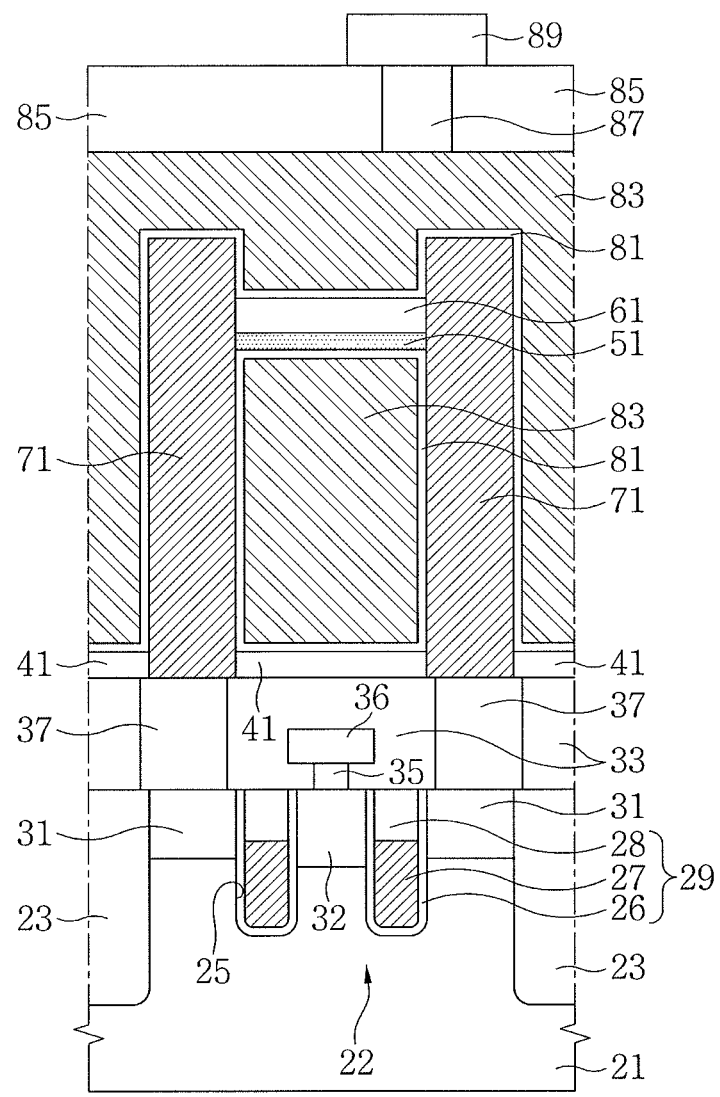
FIG. 1 illustrates a cross-sectional view of a semiconductor device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

It will be understood that, although the terms first, second, A, B, etc. may be used herein in reference to elements of the invention, such elements should not be construed as limited by these terms. For example, a first element could be termed a second element, and a second element could be termed a first element, without departing from the scope of the present invention. Herein, the term "and/or" includes any and all combinations of one or more referents.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein to describe embodiments of the invention is not intended to limit the scope of the invention. The articles "a," "an," and "the" are singular in that they have a single referent, however the use of the singular form in the present document should not preclude the presence of more than one referent. In other words, elements of the invention referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the embodiments.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

Figure 2A:
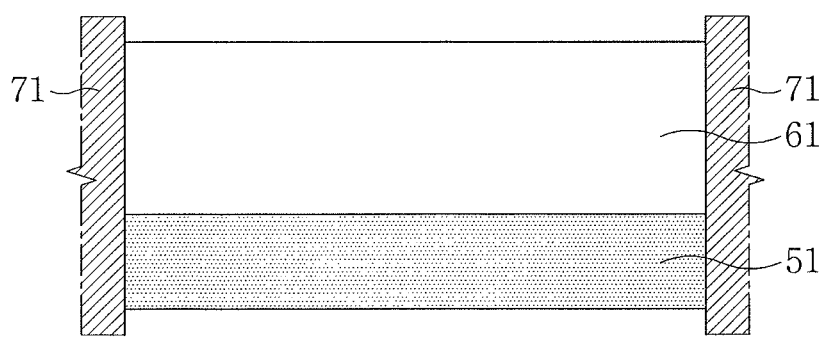
FIGS. 2A and 2B illustrate enlarged views showing a part of FIG. 1 in detail, according to an embodiment.
Figure 2B:
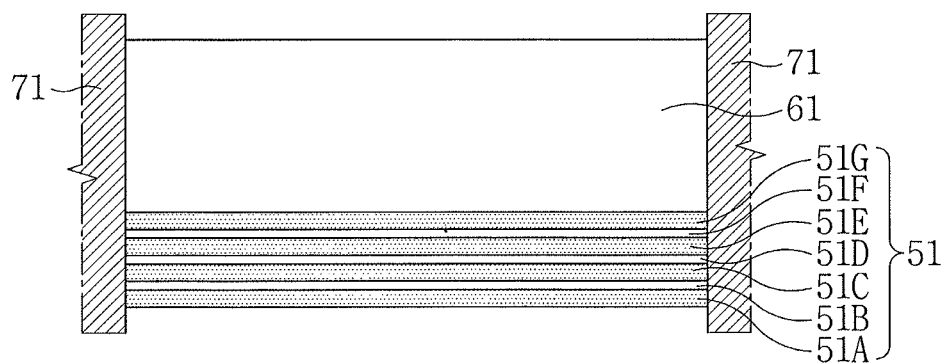

FIG. 1 illustrates a cross-sectional view of a semiconductor device in accordance with an embodiment, and FIGS. 2A and 2B illustrate enlarged views showing a part of FIG. 1 in detail.

Referring to FIG. 1, a device isolation layer 23 defining an active region 22 may be formed in a substrate 21. Gate trenches 25 may be formed across the active region 22. Gate structures 29 may be formed in the gate trenches 25. Each of the gate structures 29 may include a gate dielectric layer 26, a gate electrode 27, and a gate capping pattern 28. First and second source/drain areas 31 and 32 may be formed in the active region 22 adjacent to the gate structures 29. An interlayer insulating layer 33 may be formed on the gate structures 29 and the first and second source/drain areas 31 and 32. A bit-plug 35 and a bit-line 36 may be formed in the interlayer insulating layer 33. Buried contact plugs 37 passing through the interlayer insulating layer 33 and connected to the first source/drain areas 31 may be formed.

An etch-stop layer 41 may be formed on the interlayer insulating layer 33 and the buried contact plugs 37. Lower electrodes 71 may be formed over the buried contact plugs 37 such that they contact the plugs, and pass through the etch-stop layer 41 (e.g., protrude from layer 41). The lower electrodes 71 may protrude to a higher level than the etch-stop layer 41. In other words, the lower electrodes 71 may have a vertical height that is greater than a vertical thickness of etch-stop layer 41. The lower electrodes 71 may have a vertical height greater than a horizontal width. First and second supporters 51 and 61 may be formed between the lower electrodes 71. A capacitor dielectric layer 81 covering surfaces of the lower electrodes 71 and first and second supporters 51 and 61 may be formed. An upper electrode 83 may be formed on the capacitor dielectric layer 81. An upper insulating layer 85 may be formed on the upper electrode 83. An upper plug 87 may be formed so as to connect to upper electrode 83 and pass through upper insulating layer 85. An upper interconnection 89 in contact with the upper plug 87 may be formed over the upper insulating layer 85.

The first and second source/drain areas 31 and 32, the active region 22, the gate dielectric layer 26, and the gate electrode 27 may constitute a transistor. A plurality of such transistors may be formed repeatedly in row and column directions. The transistor(s) may function as a switching device. In other embodiments, the switching device may be a planar transistor, a sphere-shaped recess channel array transistor (SRCAT), a three-dimensional transistor, a vertical transistor, a nano-wire transistor, or a combination thereof.

The substrate 21 may be a semiconductor substrate such as a silicon wafer. The device isolation layer 23 may be formed using a shallow trench isolation (STI) process. The device isolation layer 23 may include silicon oxide, silicon nitride, silicon oxy-nitride, or a combination thereof. Each of the gate trenches 25 may cross the active region 22 and extend into the device isolation layer 23. The gate capping pattern 28 may be formed on the gate electrode 27. The gate dielectric layer 26 may be formed between the gate electrode 27 and the active region 22. The second source/drain area 32 may be formed between the gate structures 29. The first source/drain areas 31 may be formed between the gate structures 29 and the device isolation layer 23.

The gate dielectric layer 26 may include silicon oxide, silicon nitride, silicon oxy-nitride, a high-k dielectric layer (e.g., a dielectric material having a high dielectric constant k), or a combination thereof. The gate electrode 27 may include a conductive layer such as a metal, a metal silicide, a semiconductor, polysilicon, or a combination thereof. The gate capping pattern 28 may include silicon oxide, silicon nitride, silicon oxy-nitride, a low-k dielectric layer (e.g., a dielectric material having a low dielectric constant k), or a combination thereof.

The interlayer insulating layer 33 may include silicon oxide, silicon nitride, silicon oxy-nitride, a low-K dielectric layer, or a combination thereof. The interlayer insulating layer 33 may cover the entire substrate 21. The bit-plug 35 may be in contact with the second source/drain area 32 and the bit-line 36. The bit-plug 35 may include a conductive layer such as a metal, a metal silicide, a semiconductor, or a combination thereof. The bit-line 36 may include a conductive layer such as a metal, a metal silicide, a semiconductor, or a combination thereof. The buried contact plugs 37 may include a conductive layer such as a metal, a metal silicide, a semiconductor, or a combination thereof. For example, the buried contact plugs 37 may include W, Ru, TiN, or a combination thereof. The buried contact plugs 37 may be in contact with the first source/drain areas 31. The etch-stop layer 41 may include silicon oxide, silicon nitride, silicon oxy-nitride, or a combination thereof. For example, the etch-stop layer 41 may include silicon nitride.

Each of the lower electrodes 71 may pass through the etch-stop layer 41 to so as to be in contact with a corresponding buried contact plug 37. Each of the lower electrodes 71 on the substrate 21 may have a pillar shape (e.g., having a vertical height greater than a horizontal width). For example, the aspect ratio of the lower electrodes 71 may be from about 10:1 to 100:1, or more. The lower electrodes 71 may include a metal layer. The metal layer may include Ru, RuO, Pt, PtO, Ir, IrO, SrRuO (SRO), (Ba,Sr)RuO (BSRO), CaRuO (CRO), BaRuO, La(Sr,Co)O, Ti, TiN, W, WN, Ta, TaN, TiAlN, TiSiN, TaAlN, TaSiN, or a combination thereof. One or more metal layers may be provided in each of the lower electrodes. In an example embodiment, the lower electrodes 71 may include a Ru layer, a RuO layer, or a combination thereof.

Thicknesses of the first and second supporters 51 and 61 may be smaller than the vertical height of the lower electrodes 71. The first and second supporters 51 and 61 may be adjacent to upper ends of the lower electrodes 71. The first and second supporters 51 and 61 may help prevent the lower electrodes 71 from collapsing. The first and second supporters 51 and 61 may be in contact with the lower electrodes 71. For example, each supporter may include first and second opposing ends. The first ends may contact a first lower electrode, and the second ends may contact a second lower electrode. The first supporter 51 may be in contact with a bottom of the second supporter 61. The second supporter 61 may include a material having superior insulating properties as compared to that of the first supporter 51. The first supporter 51 may include a material having better adhesion to the lower electrodes 71 than the second supporter 61.

The capacitor dielectric layer 81 may cover surfaces of the lower electrodes 71 and the first and second supporters 51 and 61. Layer 81 may uniformly cover these surfaces. The capacitor dielectric layer 81 may include one or more layers. Each layer may include TaO, TaAlO, TaON, AlO, HfO, ZrO, ZrSiO, TiO, TiAlO, (Ba,Sr)TiO (BST), SrTiO (STO), BaTiO (BTO), Pb(Zr,Ti)O (PZT), (Pb,La)(Zr,Ti)O, Ba(Zr,Ti)O, Sr(Zr,Ti)O, or a combination thereof. The upper electrode 83 may cover the lower electrodes 71, and fully fill an area between the lower electrodes 71. The upper electrode 83 may include one or more metal layers, each layer including Ru, RuO, Pt, PtO, Ir, IrO, SrRuO (SRO), (Ba,Sr)RuO (BSRO), CaRuO (CRO), BaRuO, La(Sr,Co)O, Ti, TiN, W, WN, Ta, TaN, TiAlN, TiSiN, TaAlN, TaSiN, or a combination thereof. The upper insulating layer 85 may include silicon oxide, silicon nitride, silicon oxy-nitride, or a combination thereof.

The upper plug 87 and the upper interconnection 89 may include a conductive layer such as a metal, a metal silicide, a conductive carbon group, or a combination thereof.

Referring to FIG. 2A, the second supporter 61 may include a material layer having excellent insulating properties, which may help reduce or prevent leakage current between the lower electrodes 71. For example, the second supporter 61 may include silicon nitride. The first supporter 51 may include a first element, a second element, and oxygen (O). The first element and an oxide of the first element may have better adhesion to the lower electrodes 71 than the second supporter 61. The first supporter 51 including the first element and oxide of the first element may be effective in helping to prevent the lower electrodes 71 from collapsing. An oxide of the second element may have a higher band gap energy than the oxide of the first element. The oxide of the second element included in the first supporter may help reduce leakage current of the first supporter 51.

The first element, the second element, and the oxygen (O) may be mixed in a certain ratio in the first supporter 51. For example, the lower electrodes 71 may include a Ru layer, a RuO layer, or a combination thereof, the first element may be Ta, and the second element may be Si, Al, or a combination thereof. The first supporter 51 may include TaSiO, TaAlO, or a combination thereof. The first supporter 51 may be formed using, e.g., atomic layer deposition (ALD) method or a chemical vapor deposition (CVD) method. In some embodiments, the first supporter 51 may include the second element in an amount of from about 10 at % to 90 at %.

In certain example embodiments, the first supporter 51 may be a layer of or including the oxide of the first element and the oxide of the second element. For example, the first supporter may have a uniform composition including a mixture of the oxide of the first element and the oxide of the second element. In an embodiment, TaO and SiO may be mixed in the first supporter 51 (e.g., the first supporter 51 may include TaSiO). In other embodiments, TaO and AlO may be mixed in the first supporter 51 (e.g., the first supporter 51 may include TaAlO).

In certain example embodiments, certain oxides may have a lower leakage current in the amorphous state than in the crystalline state. Accordingly, the oxide of the first element may have a relatively lower leakage current in the amorphous state than in the crystalline state. The oxide of the first element may be formed so as to be in the amorphous state (e.g., at the time of formation). In certain examples, the oxide of the first element in the amorphous state may be an amorphous metal oxide. The second element and/or the oxide of the second element may help prevent the oxide of the first element in the amorphous state from being crystallized. For example, even when the first supporter 51 is exposed to high temperatures during a semiconductor fabrication process, the oxide of the first element may remain in the amorphous state. In certain example embodiments, when the oxide of the first element remains in the amorphous state, the leakage current of the first supporter 51 may be significantly reduced.

Referring to FIG. 2B, the first supporter 51 may have a configuration in which layers including the oxide of the first element in the amorphous state and the oxide of the second element, respectively, are alternately and repeatedly stacked. For example, the first supporter 51 may include first to seventh layers 51A, 51B, 51C, 51D, 51E, 51F, and 51G. The first layer 51A, the third layer 51C, the fifth layer 51E, and the seventh layer 51G may include the oxide of the first element in the amorphous state. For example, the first layer 51A, the third layer 51C, the fifth layer 51E, and the seventh layer 51G may include an amorphous-state TaO. The oxide of the first element in the amorphous state may be an amorphous metal oxide. Each of the first layer 51A, the third layer 51C, the fifth layer 51E, and the seventh layer 51G may have a vertical thickness of 0.1 nm to 5 nm.

The second layer 51B, the fourth layer 51D, and the sixth layer 51F may include the oxide of the second element. For example, the second layer 51B, the fourth layer 51D, and the sixth layer 51F may include SiO or AlO. In other embodiments, at least one of the second layer 51B, the fourth layer 51D, and the sixth layer 51F may include SiO, and the other layers (e.g., of the second layer 51B, the fourth layer 51D, and the sixth layer 51F) may include AlO.

In certain instances, the second layer 51B, the fourth layer 51D, and the sixth layer 51F may help reduce or prevent crystallization of the first layer 51A, third layer 51C, fifth layer 51E, and the seventh layer 51G. Even when the first supporter 51 is exposed to high temperatures during the semiconductor fabrication process, the first layer 51A, the third layer 51C, the fifth layer 51E, and the seventh layer 51G may remain in the amorphous state. In certain example embodiments, the oxide of the first element may remain in the amorphous state and the leakage current of the first supporter 51 (e.g., including first, third, fifth and seventh layers 51A, 51C, 51E, and 51G, respectively) may be significantly reduced.

Figure 3:
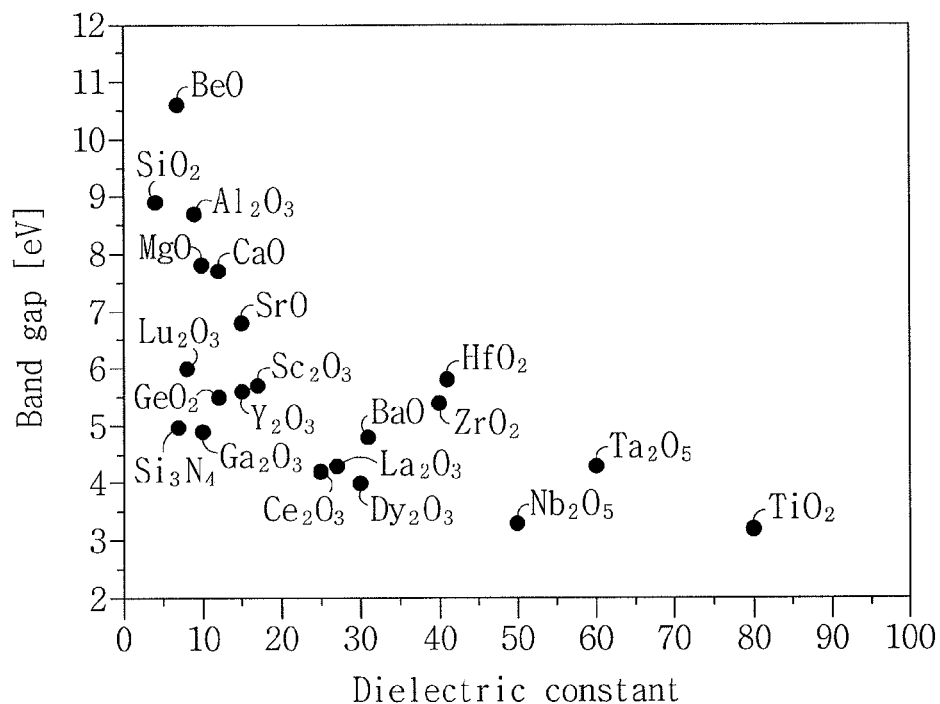
FIG. 3 illustrates a correlation chart showing band gap energies and dielectric constants of materials according to embodiments.

FIG. 3 illustrates a correlation chart showing band gap energies and dielectric constants of materials related to example embodiments. FIG. 3 includes the dielectric constant and band gap energy in electron volts (eV) of certain compounds. The horizontal axis of FIG. 3 represents the dielectric constant. The vertical axis of FIG. 3 represents the band gap energy, and the unit of scale is electron volt (eV).

Referring to FIG. 3, the second supporter 61 may include silicon nitride. The silicon nitride may have excellent insulating properties, and may advantageously reduce or suppress the leakage current between the lower electrodes 71.

With respect to the first supporter 51, the first element and/or the oxide of the first element may have better adhesion to the lower electrodes 71 than the second supporter 61. The first element may be Ta or Ti. For example, the oxide of the first element in the amorphous state may be amorphous TaO or amorphous TiO.

Still referring to FIG. 3, the oxide of the second element in the first supporter 51 may have a higher band gap energy than the oxide of the first element. For example, the oxide of the second element may be a material having a band gap energy of 5.0 eV or greater. Thus, in certain example embodiments, any of the oxides illustrated in FIG. 3 having a band gap energy of 5 eV or greater may be a suitable material for the oxide of the second element. In an exemplary embodiment, the second element may be Si, Al, Mg, Be, or a combination thereof. In an exemplary embodiment, the oxide of the second element may include SiO, AlO, MgO, BeO, or a combination thereof. The oxide of the second element may help reduce the leakage current in first supporter 51.

Figure 4:
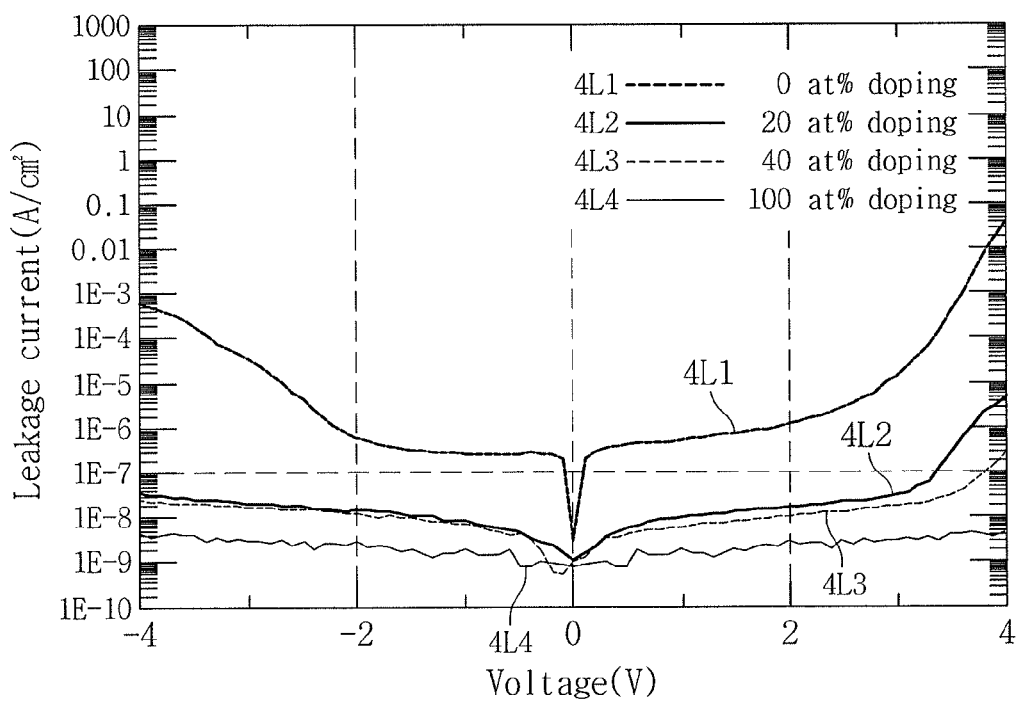
FIGS. 4 and 5 illustrate diagrams showing leakage current characteristics of semiconductor devices according to embodiments.
Figure 5:
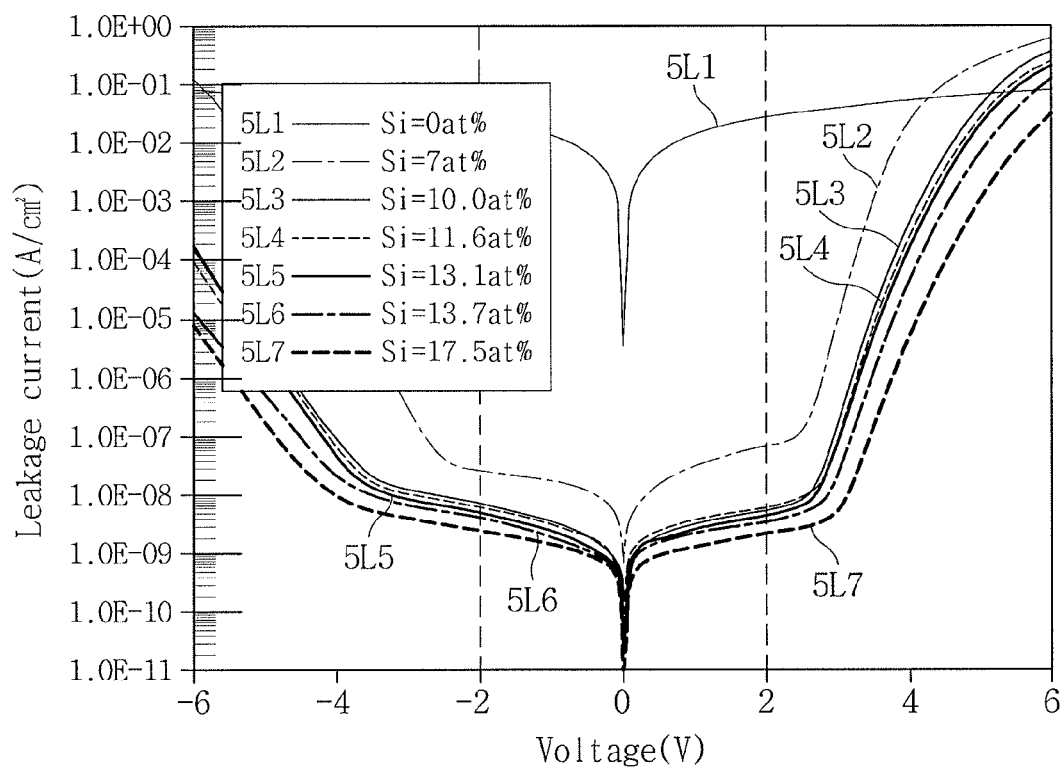

FIGS. 4 and 5 are graphs illustrating leakage current characteristics of semiconductor devices in accordance with certain example embodiments. The horizontal axis represents voltage and the unit of scale is V. The vertical axis represents leakage current and the unit of scale is A/cm$^2$. As illustrated in FIG. 3, silicon oxide and aluminum oxide have relatively high band gaps. Al and Si were selected as the second element for the example leakage current analysis shown in FIGS. 4 and 5, respectively.

Referring to FIG. 4, curve 4L1 represents leakage current characteristics of an example first supporter including the oxide of the first element only, for purposes of comparison. The oxide of the first element may be TaO. Curve 4L2 represents leakage current characteristics of another example first supporter including 20 at % of the second element. The second element may be Al. Thus, the example first supporter represented by curve 4L2 may include TaAlO. Curve 4L3 represents leakage current characteristics of yet another example first supporter including 40 at % of the second element. The second element may be Al. Thus, the example first supporter represented by curve 4L3 may include TaAlO. Curve 4L4 represents leakage current characteristics of another example embodiment of a first supporter including 100 at % of the second element. In other words, the example first supporter represented by curve 4L4 includes the oxide of the second element only. The second element may be Al. Thus, the example first supporter represented by curve 4L4 may include AlO. All of the examples of first supporters represented by curves 4L1 to 4L4 were heat-treated in a rapid thermal annealing (RTA) process at 800° C.

Still referring to FIG. 4, curve 4L1 may show a leakage current greater than $1E^{-7}$ at about 2V, and curves 4L2 to 4L4 may show leakage currents less than $1E^7$ at about 2V. From FIG. 4, it can be seen that the inclusion of the oxide of the second element in the first supporter may reduce the leakage current of the first supporter in certain example embodiments. In particular, in certain example embodiments, the inclusion of Al and/or AlO in a supporter including Ta and/or TaO may advantageously reduce the leakage current of the supporter.

Referring to FIG. 5, curve 5L1 represents leakage current characteristics of an example first supporter including the oxide of the first element only (e.g., including zero at % of the second element). The example first supporter represented by curve 5L1 includes only the oxide of the first element (e.g., it does not include the second element or oxide of the second element). The oxide of the first element may be TaO. Curve 5L2 represents leakage current characteristics of an example first supporter including 7 at % of the second element. The second element may be Si. The example first supporter represented by curve 5L2 may include TaSiO. Curve 5L3 represents leakage current characteristics of an example first supporter including 10 at % of the second element. The second element may be Si. Curve 5L4 represents leakage current characteristics of an example first supporter including 11.6 at % of the second element. The second element may be Si. Curve 5L5 represents leakage current characteristics of an example first supporter including 13.1 at % of the second element. The second element may be Si. Curve 5L6 represents leakage current characteristics of an example first supporter including 13.7 at % of the second element. The second element may be Si. Curve 5L7 represents leakage current characteristics of an example first supporter including 17.5 at % of the second element. The second element may be Si. In curves 5L1 to 5L7, all of the example first supporters were heat-treated in a RTA (e.g., rapid thermal annealing) process at 800° C.

Curves 5L1 and 5L2 show relatively high leakage currents at about 2V, and curves 5L3 to 5L7 may show relatively low leakage currents at about 2V. Curves 5L1-5L7 illustrate that the oxide of the second element may reduce the leakage current of the first supporter 51. For example, FIG. 5 illustrates that excellent electrical characteristics may be obtained when a first supporter includes the second element and/or oxide of the second element in an amount of from about 10 at % to 20 at %. The first supporter may include the first element and/or oxide in an amount of from about 10 at % to 90 at %. In particular, in certain example embodiments, the inclusion of Si and/or SiO in a supporter including Ta and/or TaO may advantageously reduce the leakage current of the supporter.

FIGS. 4 and 5 illustrate that in certain example embodiments, the inclusion of a second element and/or an oxide of the second element in a supporter may advantageously reduce the leakage current of the supporter. FIG. 4 illustrates that when the supporter includes at least about 20 at % Al and/or AlO, the leakage current may be reduced. FIG. 5 illustrates that when the supporter includes Si and/or SiO in an amount of from about 10 at % to 20 at %, the leakage current may be reduced.

FIGS. 6A to 6I and 7A to 7G are cross-sectional views of semiconductor devices including supporters, according to certain example embodiments.

Figure 6A:
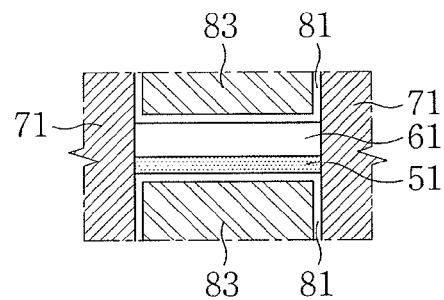
FIGS. 6A to 6I and 7A to 7G illustrate cross-sectional views of semiconductor devices according to embodiments.

Referring to FIG. 6A, the first supporter 51 may be disposed over both a portion of capacitor dielectric layer 81 and a portion of upper electrode 83, in between lower electrodes 71. Second supporter 61 may be disposed over first supporter 51. First and second supporters 51 and 61 may be arranged such that first ends of the supporters contact a lower electrode 71, and second opposing ends of the supporters contact another lower electrode 71. An upper surface of first supporter 51 may be in contact with a lower surface of the second supporter 61. The first supporter 51 may have a smaller vertical thickness than the second supporter 61. The first supporter 51 may be in contact with the lower electrodes 71. The second supporter 61 may be in contact with the lower electrodes 71. A lower surface of the first supporter 51 and an upper surface of the second supporter 61 may be in contact with the capacitor dielectric layer 81.

Figure 6B:
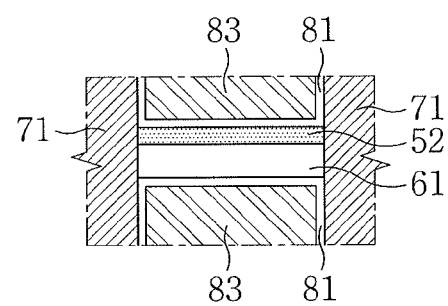

Referring to FIG. 6B, a third supporter 52 may be formed on the second supporter 61 in an embodiment. The first supporter 51 may not be included in the embodiment illustrated in FIG. 6B. The third supporter 52 may include the same materials discussed herein with respect to first supporter 51. In the FIG. 6B embodiment, the second supporter 61 may be disposed over both a portion of capacitor dielectric layer 81 and a portion of upper electrode 83, in between lower electrodes 71. The third supporter 52 may be disposed over second supporter 61. An upper surface of second supporter 61 may be in contact with a lower surface of the third supporter 52. The third supporter 52 and the second supporter 61 may be in contact with the lower electrodes 71. For example, third and second supporters 52 and 61 may be arranged such that first ends of the supporters contact a lower electrode 71, and second Opposing ends of the supporters contact another lower electrode 71. The third supporter 52 may have a smaller thickness (e.g., vertical thickness) than the second supporter 61. A lower surface of the second supporter 61 and an upper surface of the third supporter 52 may be in contact with the capacitor dielectric layer 81.

Figure 6C:
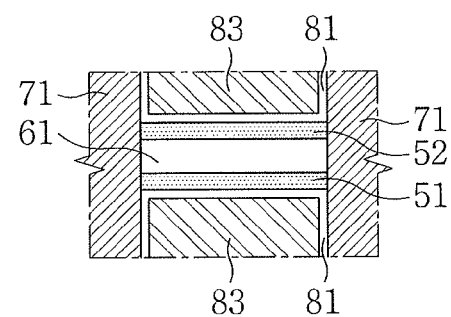

Referring to the FIG. 6C embodiment, the second supporter 61 may be interposed between the first supporter 51 and the third supporter 52. For example, the first supporter may be disposed over both a portion of capacitor dielectric layer 81 and a portion of upper electrode 83, in between lower electrodes 71. The second supporter 61 may be disposed over the first supporter 51 such that an upper surface of the first supporter and a lower surface of the second supporter are in contact. The third supporter 52 may be disposed over the second supporter 61 such that an upper surface of the second supporter 61 and a lower surface of the third supporter 52 are in contact. The first supporter 51, the second supporter 61, and the third supporter 52 may be in contact with the lower electrodes 71. For example, first, second, and third supporters 51, 61, and 52 may be arranged such that first ends of the supporters contact a lower electrode 71, and second opposing ends of the supporters contact another lower electrode 71. The lower surface of the first supporter 51 and the upper surface of the third supporter 52 may be in contact with the capacitor dielectric layer 81.

Figure 6D:
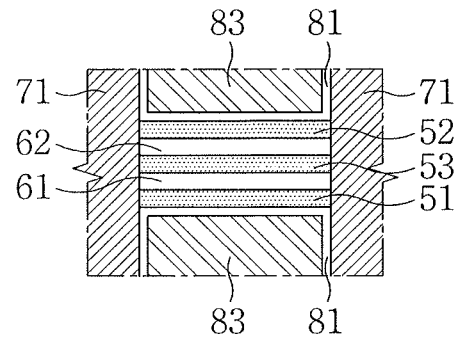

Referring to FIG. 6D, in another embodiment, first to fifth supporters 51, 61, 52, 53, and 62 may be formed between the lower electrodes 71. Each of the first to fifth supporters 51, 61, 52, 53, and 62 may be in contact with the lower electrodes 71. For example, the supporters may be arranged such that first ends of the supporters contact a lower electrode 71, and second opposing ends of the supporters contact another lower electrode 71. The first supporter 51 may be disposed over both a portion of capacitor dielectric layer 81 and a portion of upper electrode 83, in between lower electrodes 71. The second supporter 61 may be formed on the first supporter 51, the fourth supporter 53 may be formed on the second supporter 61, the fifth supporter 62 may be formed on the fourth supporter 53, and the third supporter 52 may be formed on the fifth supporter 62. The lower surface of the first supporter 51 and the upper surface of the third supporter 52 may be in contact with the capacitor dielectric layer 81.

Still referring to the FIG. 6D embodiment, the second supporter 61 and the fifth supporter 62 may include the same material. For example, the second supporter 61 and the fifth supporter 62 may both include silicon nitride. In some embodiments, the second supporter 61 and the fifth supporter 62 may include silicon oxide or silicon oxy-nitride. In some embodiments, the second and fifth supporters may each include one or more of silicon nitride, silicon oxide, or silicon oxynitride.

The first supporter 51, the third supporter 52, and the fourth supporter 53 may include the same material. Each of the first supporter 51, the third supporter 52, and the fourth supporter 53 may include a first element, a second element, and oxygen (O). In other embodiments, each of the first supporter 51, the third supporter 52, and the fourth supporter 53 may include an oxide of the first element. The second supporter 61 and the fifth supporter 62 may include an oxide of the second element.

Figure 6E:
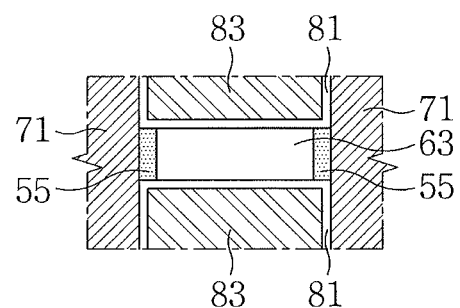

Referring to FIG. 6E, a sixth supporter 63 and seventh supporters 55 may be formed between the lower electrodes 71. The seventh supporters 55 may be formed between the lower electrodes 71 and the sixth supporter 63. Two seventh supporters 55 may be provided, and each seventh supporter 55 may be provided adjacent to opposing surfaces of respective lower electrodes 71. The seventh supporters 55 may have a greater height (e.g., vertical thickness) than horizontal width in certain examples. The seventh supporters 55 may be in contact with the lower electrodes 71 and lateral (e.g., side) surfaces of the sixth supporter 63. Upper and lower surfaces of the sixth supporter 63 and upper and lower surfaces of seventh supporters 55 may each be in contact with the capacitor dielectric layer 81. In certain example embodiments, the sixth supporter 63 may not be in contact with the lower electrodes 71.

The sixth supporter 63 may include the same materials described with respect to second supporter 61. For example, the sixth supporter 63 may include silicon nitride. The seventh supporters 55 may include the same materials described with respect to first supporter 51. The seventh supporters 55 may include a first element, a second element, and oxygen (O). In another embodiment, the seventh supporters 55 may include an oxide of the first element, and the sixth supporter 63 may include an oxide of the second element.

Figure 6F:
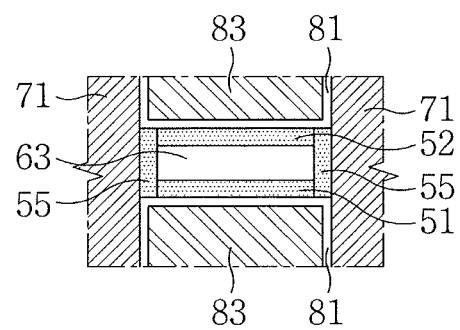

Referring to FIG. 6F, the first supporter 51, the third supporter 52, the sixth supporter 63, and the seventh supporters 55 may be formed between the lower electrodes 71 in an embodiment. Sixth supporter 63 and seventh supporters 55 may be provided as described with respect to FIG. 6E. However, in this embodiment, first supporter 51 may be disposed over a portion of the upper electrode 83 and a portion of capacitor dielectric layer 81, and third supporter 52 may be disposed over sixth supporter 63. First supporter 51, sixth supporter 63, and third supporter 52 may be disposed in between seventh supporters 55.

Still referring to the FIG. 6F embodiment, in certain instances first supporter 51, third supporter 52, and seventh supporters 55 may include any of the same materials described with respect to first supporter 51. First, third, and seventh supporters 51, 52, and 55 may include the same materials as each other, or at least one of these supporters may include different materials than another. The sixth supporter 63 may include the same materials described with respect to second supporter 61. In another embodiment, first, third, and seventh supporters 51, 52, and 55 may include an oxide of the first element, and the sixth supporter 63 may include an oxide of the second element.

Figure 6G:
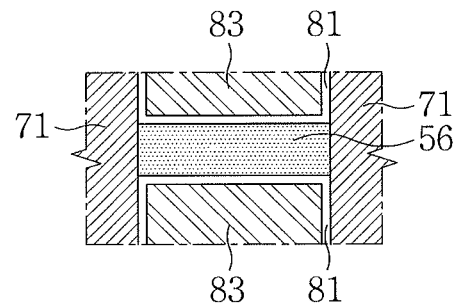

Referring to FIG. 6G, an eighth supporter 56 may be formed between the lower electrodes 71. The eighth supporter 56 may be in contact with the lower electrodes 71. Upper and lower surfaces of the eighth supporter 56 may be in contact with the capacitor dielectric layer 81. The eighth supporter 56 may include a first element, a second element, and oxygen (O). The eighth supporter 56 may include the same materials described herein with respect to the first supporter 51. In an exemplary embodiment, the eighth supporter 56 may have a similar or identical composition to that of the first supporter 51 in FIG. 2A or the first supporter 51 in FIG. 2B.

Figure 6H:
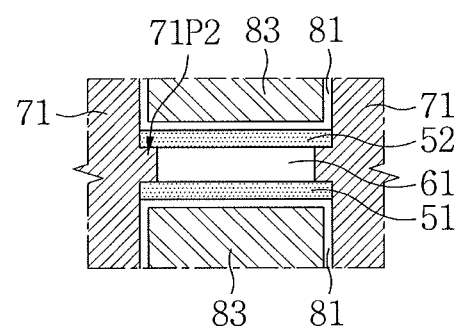

Referring to FIG. 6H, the first supporter 51, the second supporter 61, and the third supporter 52 may be formed between the lower electrodes 71. The first supporter 51 may be disposed over a portion of the capacitor dielectric layer 81, the second supporter 61 may be formed on the first supporter 51, and the third supporter 52 may be formed over the second supporter 61. In this embodiment, the second supporter 61 may have a smaller horizontal width than the first supporter 51 and the third supporter 52. The lower electrodes 71 may include protrusions 71P2. The protrusions 71P2 of the lower electrodes 71 may extend (e.g., protrude) between the first supporter 51 and the third supporter 52. The protrusions 71P2 of the lower electrodes 71 may be in contact with opposing ends (e.g., lateral surfaces or side surfaces) of the second supporter 61. Portions of the first and third supporters 51 and 52 may be in contact with upper or lower edges of the protrusions 71P2 and/or a surface of lower electrodes 71.

Figure 6I:
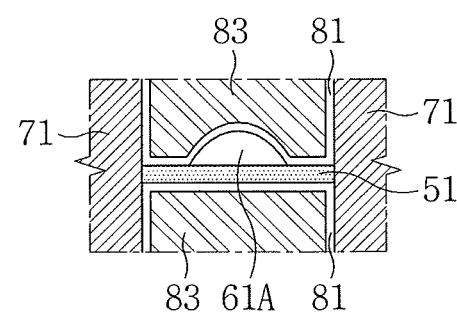

Referring to FIG. 6I, a first supporter 51 may be formed over a portion of the capacitor dielectric layer 81 in between lower electrodes 71. The first supporter 51 may be in contact with the lower electrodes 71. A second supporter 61A having a smaller horizontal width than the first supporter 51 may be formed on the first supporter 51. The second supporter 61A may be spaced apart from the lower electrodes 71. An upper surface of the second supporter 61A may be in contact with the capacitor dielectric layer 81, and a lower surface of the second supporter 61A may be in contact with the first supporter 51. Second supporter 61A may include the same materials described in connection with second supporter 61. Second supporter 61A may have a semicircle shape, but may be formed in other shapes according to different embodiments.

Figure 7A:
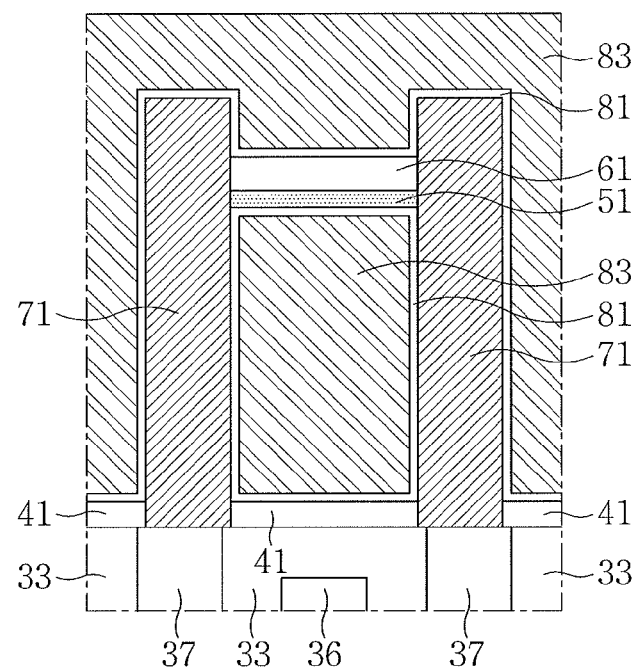

Referring to FIG. 7A, the lower electrodes 71 may be in contact with the etch-stop layer 41, the first supporter 51, and the second supporter 61. The lower electrodes may also be in contact with layer 81. The etch-stop layer 41 may be formed near a lower end of the lower electrodes 71, and the first supporter 51 and the second supporter 61 may be formed in between the lower electrodes 71 near an upper end of the lower electrodes 71. The second supporter 61 may be disposed over an upper surface of the first supporter 51.

Figure 7B:
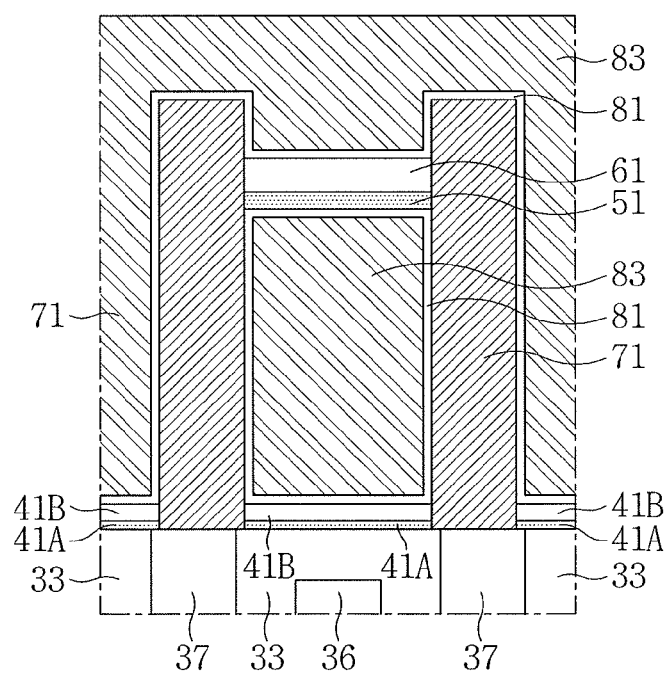

Referring to FIG. 7B, a semiconductor device according to an embodiment may include etch-stop layers 41A and 41B. Etch-stop layer 41A may be formed over the interlayer insulating layer 33 and the buried contact plugs 37. Etch-stop layer 41B may be formed over layer 41A. Lower electrodes 71 may pass through the etch-stop layers 41A and 41B and contact or connect to the buried contact plugs 37. First and second supporters 51 and 61 may be formed between the lower electrodes 71 near an upper end of lower electrodes 71.

The etch-stop layers 41A and 41B may have a similar configuration to the first and second supporters 51 and 61 in that the etch-stop layers 41A and 41B may include a sequentially stacked first etch-stop layer 41A and second etch-stop layer 41B. The first etch-stop layer 41A may include the same materials and/or composition as discussed herein with respect to first supporter 51. The second etch-stop layers 41B may include the same materials and/or composition as discussed herein with respect to second supporter 61.

Figure 7C:
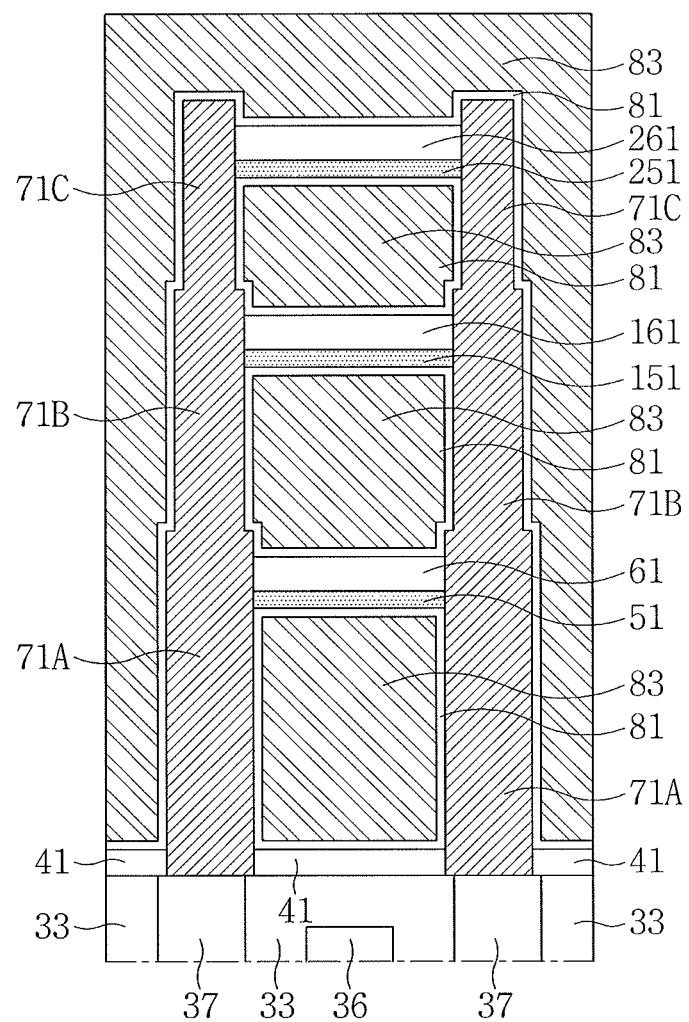

Referring to FIG. 7C, each of lower electrodes may include first lower electrodes 71A, second lower electrodes 71B, and third lower electrodes 71C. The second lower electrodes 71B may be formed on respective first lower electrodes 71A, and the third lower electrodes 71C may be formed on respective second lower electrodes 71B. The first lower electrodes 71A, the second lower electrodes 71B, and the third lower electrodes 71C may have different horizontal widths and vertical heights from each other. For example, the first lower electrodes 71A may have a greater horizontal width and vertical height than second lower electrodes 71B, and second lower electrodes 71B may have a greater horizontal width and vertical height than third lower electrodes 71C.

Still referring to the FIG. 7C embodiment, first supporter 51, a second supporter 61, a ninth supporter 151, a tenth supporter 161, an eleventh supporter 251, and a twelfth supporter 261 may be formed between the lower electrodes 71A, 71B, and 71C. The second supporter 61 may be disposed over first supporter 51. The first supporter 51 and the second supporter 61 may be in contact with opposing sides of respective first lower electrodes 71A. The tenth supporter 161 may be disposed over the ninth supporter 151. The ninth supporter 151 and the tenth supporter 161 may be in contact with opposing sides of respective second lower electrodes 71B. The twelfth supporter 261 may be disposed over eleventh supporter 251. The eleventh supporter 251 and the twelfth supporter 261 may be in contact with opposing sides of third lower electrode 71C.

The first supporter 51, the ninth supporter 151, and the eleventh supporter 251 may include the first element, the second element, and oxygen (O), as discussed with respect to first supporter 51. The second supporter 61, the tenth supporter 161, and the twelfth supporter 261 may include silicon nitride, or may include other materials discussed with respect to second supporter 61. Each of supporters 61, 161, and 261 may include the same or different materials. In another embodiment, the first supporter 51, the ninth supporter 151, and the eleventh supporter 251 may include an oxide of the first element, and the second supporter 61, the tenth supporter 161, and the twelfth supporter 261 may include an oxide of the second element. Each of the first supporter 51, the ninth supporter 151, and the eleventh supporter 251 may include the same or different materials, present in the same or different respective amounts. Each of the second supporter 61, the tenth supporter 161, and the twelfth supporter 261 may include the same or different materials, present in the same or different respective amounts.

Figure 7D:
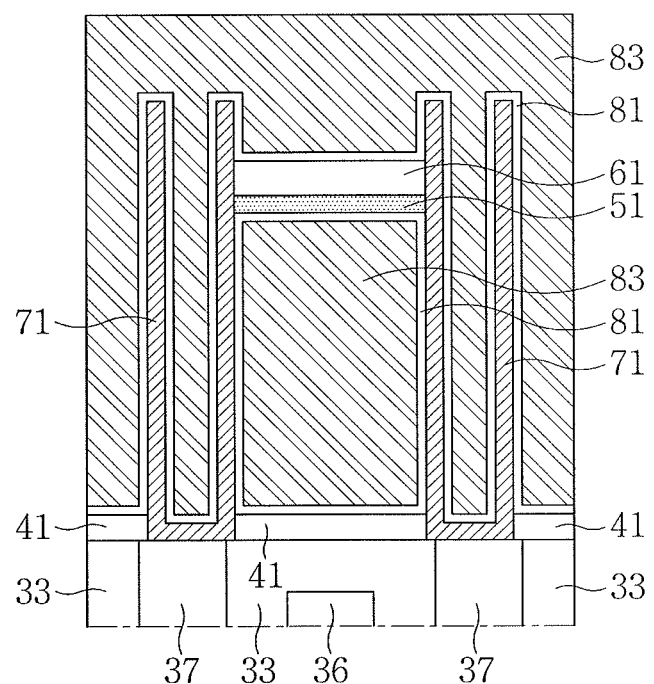

Referring to FIG. 7D, the lower electrodes 71 may be formed in a substantially U-shaped formation, and/or may have a cylindrical shape or a cup shape. Each lower electrode may have two substantially parallel vertical pillar-shaped portions (e.g., an inner vertical portion and an outer vertical portion) connected by a lower horizontal portion. The lower horizontal portion may be provided over layer 33 and/or contact plugs 37. The lower horizontal portion of lower electrodes 71 may pass through and/or contact etch-stop layer 41. Portions of the upper electrode 83 may be disposed between the vertical portions of each lower electrode 71. First supporter 51 and second supporter 61 may be disposed near an upper end of the lower electrodes 71, in between opposing inner vertical portions.

Figure 7E:
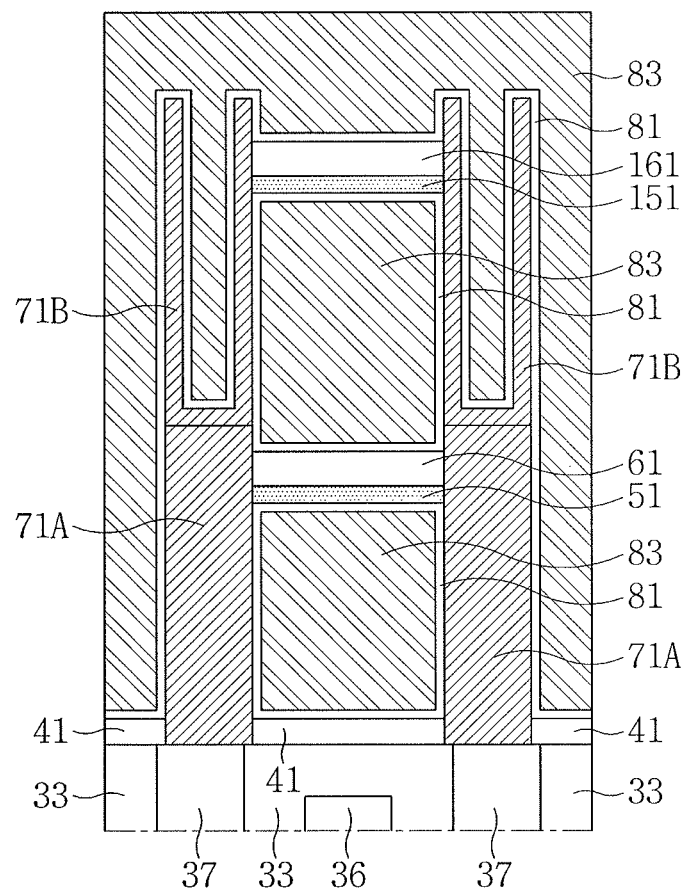

Referring to FIG. 7E, first lower electrodes 71A and second lower electrodes 71B may be provided. First lower electrodes 71A may have a pillar shape, and second lower electrodes 71B may be formed in a substantially U-shaped formation, and/or may have a cylindrical shape or a cup shape. For example, each second lower electrode 71B may have two substantially parallel vertical pillar-shaped portions (e.g., an inner vertical portion and an outer vertical portion) connected by a lower horizontal portion. Second lower electrodes 71B may be provided over a top surface of first lower electrodes 71A. For example, a lower surface of the lower horizontal portion of lower electrodes 71B may be disposed over and/or contact an upper surface of lower electrodes 71A. The first supporter 51 and the second supporter 61 may be formed proximate to upper portions of first lower electrodes 71A. The supporters may be in contact with the first lower electrodes 71A. Ninth supporter 151 and tenth supporter 161 may be formed proximate to upper portions of second lower electrodes 71B. Ninth supporter 151 and tenth supporter 161 may be in contact with a portion of second lower electrodes 71B.

Still referring to FIG. 7E, the first supporter 51 and the ninth supporter 151 may include the first element, the second element, and oxygen (O), as discussed with respect to first supporter 51. The second supporter 61 and the tenth supporter 161, and the twelfth supporter 261 may include silicon nitride, or may include other materials discussed with respect to second supporter 61. Supporters 61 and 161 may include the same or different materials. In another embodiment, the first supporter 51 and the ninth supporter 151 may include an oxide of the first element, and the second supporter 61 and the tenth supporter 161 may include an oxide of the second element. First supporter 51 and the ninth supporter 151 may include the same or different materials, present in the same or different respective amounts. The second supporter 61 and the tenth supporter 161 may include the same or different materials, present in the same or different respective amounts.

Figure 7F:
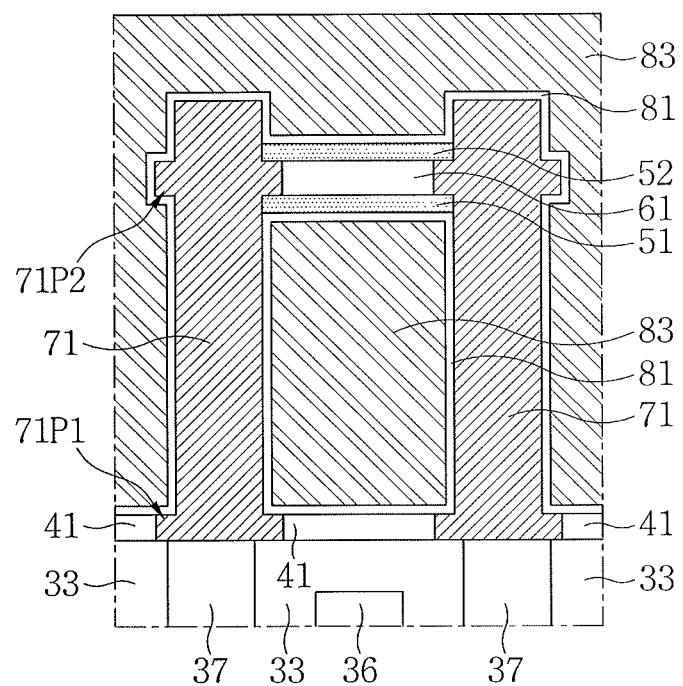

Referring to FIG. 7F, each of the lower electrodes 71 may include a first protrusion 71P1 and a second protrusion 71P2. The first protrusion 71P1 may be disposed within and/or in contact with the etch-stop layer 41. The first protrusion 71P1 may extend beyond (e.g. protrude from) first and second lateral side surfaces of each lower electrode 71, though in other example embodiments the first protrusion 71P1 may only protrude from one lateral side surface of each of the lower electrodes 71. The lower electrodes 71 may be disposed over and/or in contact with one or more of interlayer insulating layer 33 and the buried contact plugs 37. The second protrusion 71P2 may extend beyond (e.g. protrude from) first and second lateral side surfaces of each lower electrode 71, though in other example embodiments the second protrusion 71P2 may only protrude from one later side surface of each of the lower electrodes 71. The second protrusion 71P2 may extend between the first supporter 51 and the third supporter 52. The second protrusion 71P2 may be in contact with the first supporter 51, the second supporter 61, and the third supporter 52. For example, the second protrusions 71P2 may protrude such that a lateral surface of each second protrusion 71P2 contacts a lateral surface of second supporter 61. In certain examples, a portion of a lower surface of third supporter 52 and a portion of an upper surface of first supporter 51 may contact upper and lower surfaces of the second protrusion 71P2, respectively.

Figure 7G:
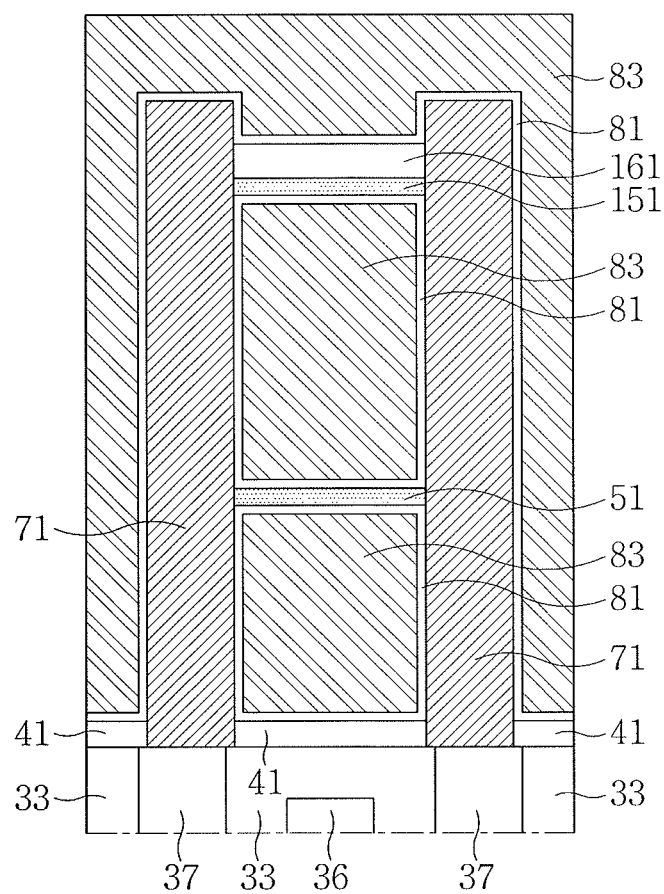

Referring to FIG. 7G, the lower electrodes 71 may have a pillar shape as described herein. A first supporter 51, a ninth supporter 151, and a tenth supporter 161 may be formed between the lower electrodes 71. The first supporter 51 and the ninth supporter 151 may include the first element, the second element, and oxygen (O) as described herein. The tenth supporter 161 may be silicon nitride. In other example embodiments, the first supporter 51 and the ninth supporter 151 may include an oxide of the first element, and the tenth supporter 161 may include an oxide of the second element.

The first supporter 51 may be formed at an intermediate level between upper ends and lower ends of the lower electrodes 71. The first supporter 51 may be referred to as an intermediate supporter. The first supporter 51 may be in contact with the lower electrodes 71. Upper and lower surfaces of the first supporter 51 may be in contact with the capacitor dielectric layer 81.

The tenth supporter 161 may be formed on the ninth supporter 151. The tenth supporter 161 may be in contact with the ninth supporter 151. The ninth supporter 151 may be referred to as a first upper supporter, and the tenth supporter 161 may be referred to as a second upper supporter. The ninth supporter 151 and the tenth supporter 161 may be in contact with the lower electrodes 71. The ninth supporter 151 and the tenth supporter 161 may be formed near the upper ends of the lower electrodes 71. The ninth supporter 151 and the tenth supporter 161 may be formed so as to be spaced apart from the first supporter 51.

Figure 8:
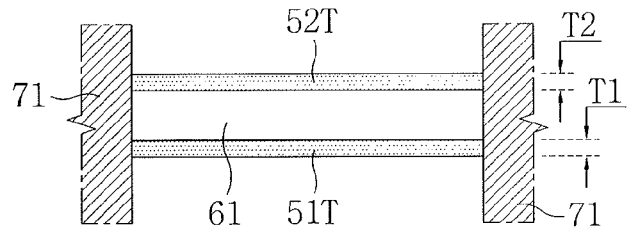
FIG. 8 illustrates a cross-sectional view of a semiconductor device according to an embodiment.

FIG. 8 illustrates a cross-sectional view of a semiconductor device in accordance with an example embodiment.

Referring to FIG. 8, a first supporter 51T, a second supporter 61, and a third supporter 52T may be formed between the lower electrodes 71. The second supporter 61 may include a material having better insulating properties than the first supporter 51T and the third supporter 52T. For example, the second supporter 61 may include silicon nitride. The first supporter 51T and the third supporter 52T may include a material having better adhesion to the lower electrodes 71 than the second supporter 61. The first supporter 51T and the third supporter 52T may include an oxide of the first element in the amorphous state. The oxide of the first element in the amorphous state may be formed using an ALD process, a CVD process, etc. The oxide of the first element in the amorphous state may have better adhesion to the lower electrodes 71 than the second supporter 61. The first element may be Ta or Ti. For example, the oxide of the first element in the amorphous state may be amorphous TaO. However, the first element may be any element described with respect to the first supporter 51.

The first supporter 51T may have a first vertical thickness T1, and the third supporter 52T may have a second vertical thickness T2. Each of the first vertical thickness T1 and the second vertical thickness T2 may be from about 0.1 nm to 5 nm. It has been found that in certain example embodiments, the first supporter 51T with the first vertical thickness T1 and the third supporter 52T with the second vertical thickness T2 may remain in the amorphous state even upon exposure to high temperatures such as those used for semiconductor fabrication processes. The oxide of the first element may have a relatively lower leakage current in the amorphous state than in the crystalline state. The first supporter 51T with the first vertical thickness T1 and the third supporter 52T with the second vertical thickness T2 may help reduce or minimize the leakage current and may help prevent the lower electrodes 71 from collapsing.

Figure 9:
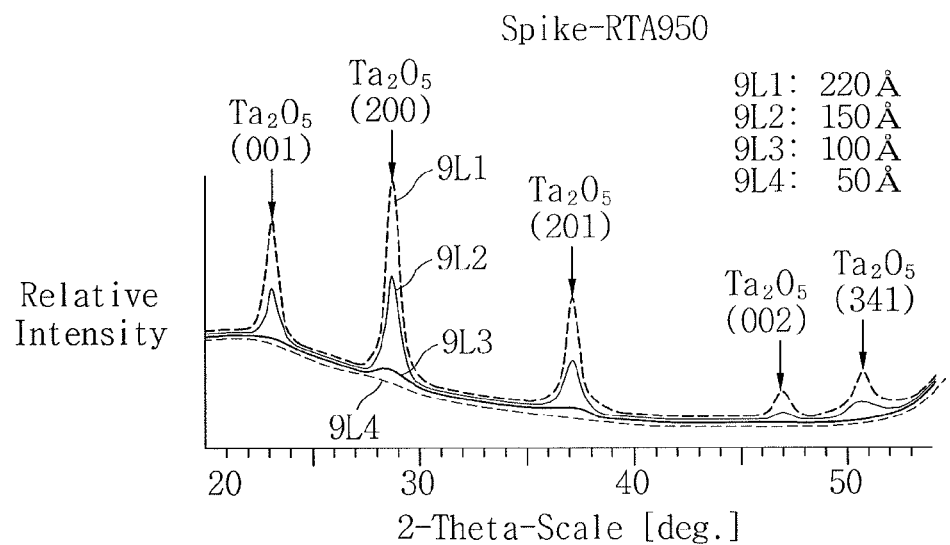
FIGS. 9 and 10 illustrate graphs showing X-ray diffractometer (XRD) analysis of semiconductor devices according to embodiments.
Figure 10:
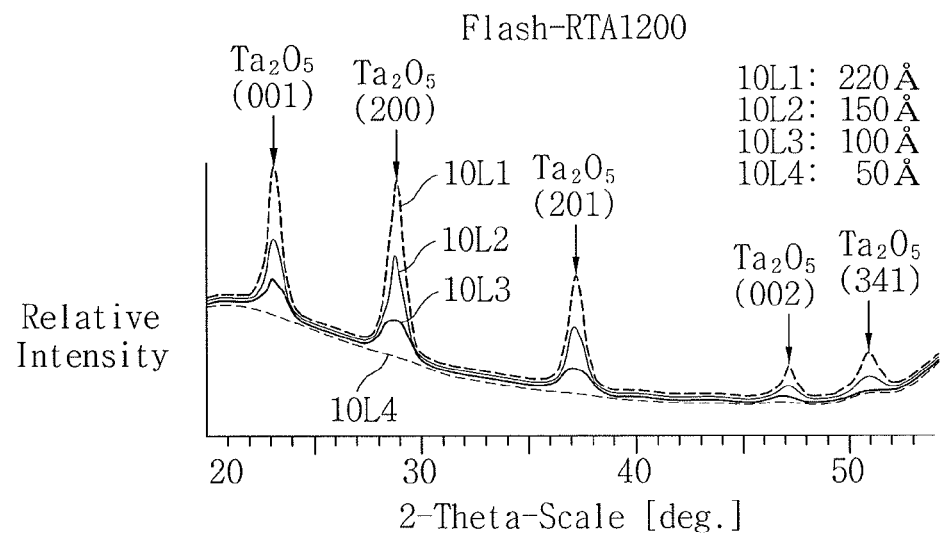

FIGS. 9 and 10 illustrate graphs showing X-ray diffraction (XRD) analysis (e.g., performed with a diffractometer) of semiconductor devices in accordance with certain example embodiments. The horizontal axes in FIGS. 9 and 10 represent 2-Theta-Scale, and the unit of scale is degree (deg.). The 2-Theta-Scale may be interpreted as a diffraction angle. The vertical axes in FIGS. 9 and 10 represent relative intensity, and the unit of scale is cycles per second (cps). The relative intensity may be interpreted as diffraction strength. In FIGS. 9 and 10, the relative intensity peaks indicate crystallization.

Referring to FIG. 9, the supporters subjected to the XRD analysis included TaO. All of the first supporters 51T were heat-treated in a Spike-RTA process at 950° C. The vertical thicknesses of the first supporters 51T evaluated in FIG. 9 are as follows: 22 nm in curve 9L1, 15 nm in curve 9L2, 10 nm in curve 9L3, and 5 nm in curve 9L4. In curves 9L1, 9L2, and 9L3, a peak of crystallized TaO is observed in the XRD analysis for the first supporter 51T. In curve 9L4, the peak of the crystallized TaO is not observed in the XRD analysis for the first supporter 51T.

Referring to FIG. 10, the supporters subjected to the XRD analysis included TaO. All of the first supporters 51T were heat-treated in a Flash-RTA process at 1200° C. The vertical thicknesses of the first supporters 51T evaluated in FIG. 10 are as follows: 22 nm in curve 10L1, 15 nm in curve 10L2, 10 nm in curve 10L3, and 5 nm in curve 10L4. In curves 10L1, 10L2, and 10L3, the peak of the crystallized TaO is observed in the XRD analysis for the first supporter 51T. In curve 10L4, the peak of the crystallized TaO is not observed in the XRD analysis for the first supporter 51T.

As shown in the experimental embodiments of FIGS. 9 and 10, when the first supporter 51T is formed so as to have a thickness of 5 nm or less, the first supporter 51T may remain in the amorphous state even upon exposure to high temperatures.

In certain example embodiments, TaO may have a relatively lower leakage current in the amorphous state than in the crystalline state. For example, when the first supporter 51T is formed to be thin and have a thickness of from about 0.1 nm to 5 nm, the first supporter 51T may advantageously maintain the amorphous state even while being exposed to high temperatures.

FIGS. 11A to 11G illustrate cross-sectional views for describing semiconductor devices in accordance with certain example embodiments.

Figure 11A:
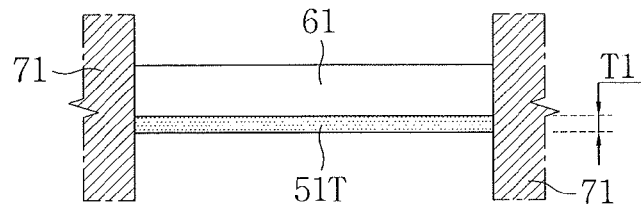
FIGS. 11A to 11G illustrate cross-sectional views of semiconductor devices according to embodiments.
Figure 11B:
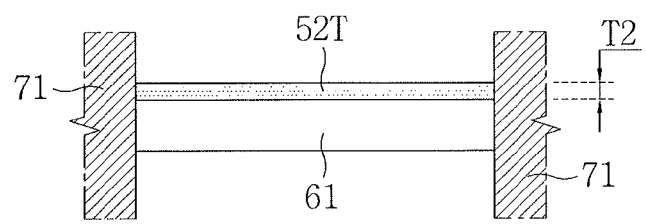
Figure 11C:
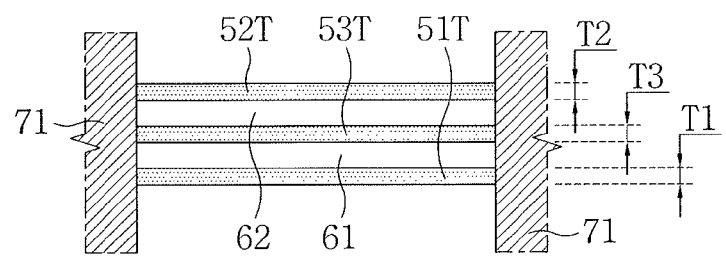

Referring to FIG. 11A, the first supporter 51T may be in contact with a lower surface of the second supporter 61. The first supporter 51T may have the first vertical thickness T1. The first vertical thickness T1 may be from about 0.1 nm to 5 nm. Referring to FIG. 11B, the third supporter 52T may be formed on the second supporter 61. The third supporter 52T may have the second vertical thickness T2. The second vertical thickness T2 may be from about 0.1 nm to 5 nm. Referring to FIG. 11C, first to fifth supporters 51T, 61, 52T, 53T, and 62 may be formed between the lower electrodes 71. The first supporter 51T may have the first vertical thickness T1, the third supporter 52T may have the second vertical thickness T2, and the fourth supporter 53T may have a third vertical thickness T3. Each of the first vertical thickness T1, second vertical thickness T2, and third vertical thickness T3 may be from about 0.1 nm to 5 nm. Each of the second supporter 61 and the fifth supporter 62 may be thicker than the first supporter 51T, the third supporter 52T, and the fourth supporter 53T. The second supporter 61 and the fifth supporter 62 may include silicon nitride. In other embodiments, the second supporter 61 and the fifth supporter 62 may include an oxide of the second element.

In still other embodiments, each of the first supporter 51T, the third supporter 52T, and the fourth supporter 53T may include an amorphous metal oxide. For example, in an exemplary embodiment, each of the first supporter 51T, the third supporter 52T, and the fourth supporter 53T may include amorphous TaO. The second supporter 61 and the fifth supporter 62 may include silicon nitride, silicon oxy-nitride, silicon oxide, aluminum oxide, or a combination thereof.

Figure 11D:
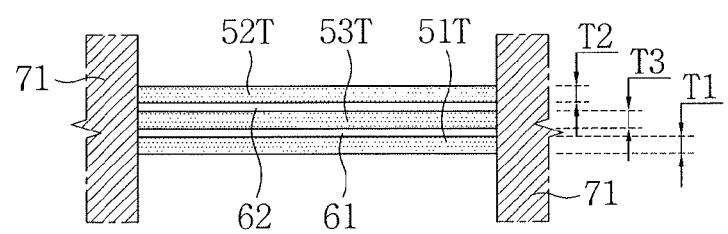

Referring to FIG. 11D, each of the second supporter 61 and the fifth supporter 62 may be thinner than each of the first supporter 51T, the third supporter 52T, and the fourth supporter 53T. The second supporter 61 and the fifth supporter 62 may include an oxide of the second element. The supporters illustrated in FIG. 11D may include the same materials discussed with respect to the FIG. 11C embodiment.

Figure 11E:
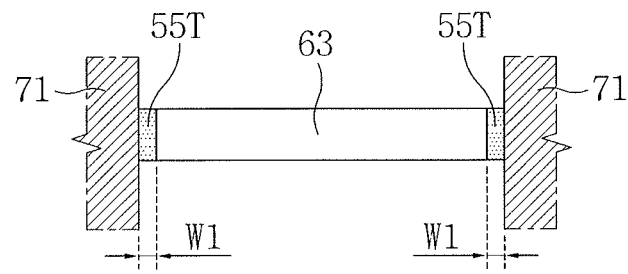

Referring to FIG. 11E, a sixth supporter 63 and seventh supporters 55T may be formed between the lower electrodes 71. Each of the seventh supporters 55T may have a first horizontal width W1. The first horizontal width W1 may be from about 0.1 nm to 5 nm. The seventh supporters 55T may include the same material as discussed herein with respect to seventh supporters 55 and/or the first supporter 51 or 51T. The sixth supporter 63 may include the same material as discussed herein with respect to the second supporter 62.

Figure 11F:
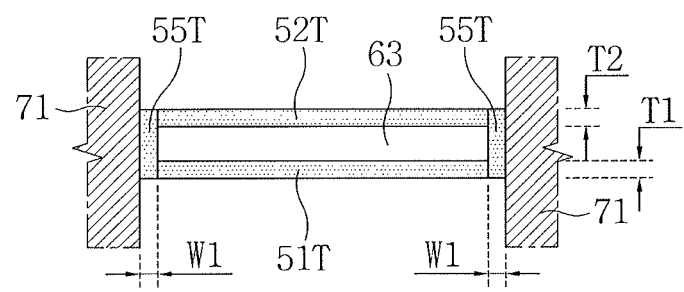

Referring to FIG. 11F, the first supporter 51T, the third supporter 52T, the sixth supporter 63, and the seventh supporters 55T may be formed between the lower electrodes 71.

Figure 11G:
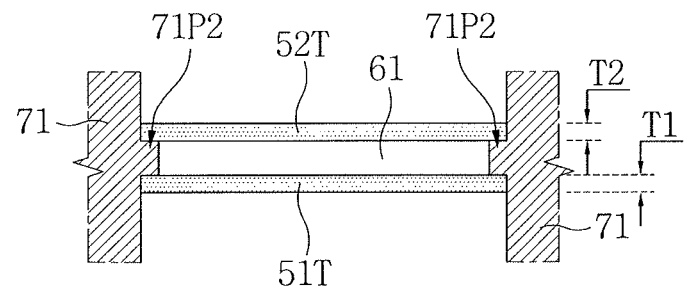

Referring to FIG. 11G, the first supporter 51T, the second supporter 61, and the third supporter 52T may be formed between the lower electrodes 71. The protrusions 71P2 of the lower electrodes 71 may extend between the first supporter 51T and the third supporter 52T so as to contact lateral side surfaces of second supporter 61.

FIGS. 12 to 19 illustrate cross-sectional views relating to a method of forming a semiconductor device in accordance with certain example embodiments.

Figure 12:
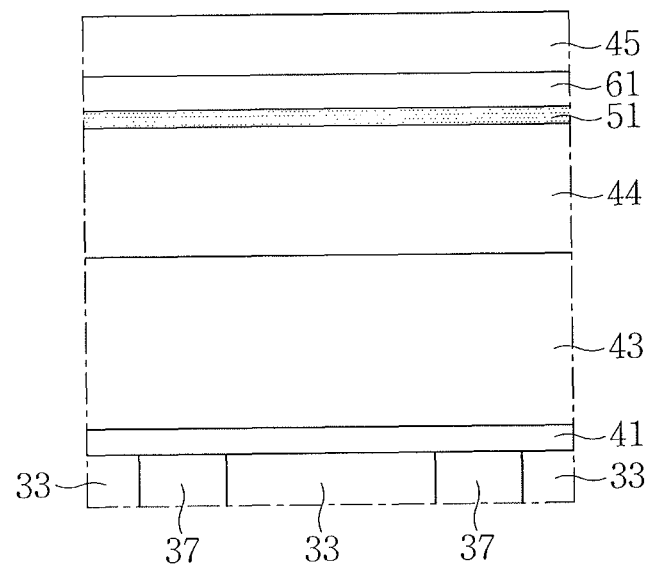
FIGS. 12 to 32 illustrate cross-sectional views of methods for forming semiconductor devices according to embodiments.

Referring to FIG. 12, an etch-stop layer 41 may be formed on buried contact plugs 37 and an interlayer insulating layer 33. A first molding layer 43, a second molding layer 44, a first supporter 51, a second supporter 61, and a third molding layer 45 may be sequentially formed on the etch-stop layer 41.

The buried contact plugs 37 and the interlayer insulating layer 33 may be provided on the substrate (reference number 21 in FIG. 1). The switching devices as described with reference to FIG. 1 may be formed on the substrate (reference number 21 in FIG. 1). The buried contact plugs 37 may be electrically connected to the switching devices. The buried contact plugs 37 and the interlayer insulating layer 33 may be formed so as to have a flat or substantially flat surface using a planarization process.

The etch-stop layer 41 may cover the entire substrate (reference number 21 in FIG. 1). The sequentially stacked first molding layer 43 and second molding layer 44 may cover the entire etch-stop layer 41. The sequentially stacked first supporter 51 and second supporter 61 may cover the entire second molding layer 44. The third molding layer 45 may cover the entire second supporter 61. The etch-stop layer 41 may be formed of an insulating layer having an etch selectivity with respect to the first molding layer 43, the second molding layer 44, and the third molding layer 45. For example, the etch-stop layer 41 may be formed using a nitride. Etch-stop layer 41 may be a nitride layer such as an SiN-inclusive layer. The first molding layer 43, the second molding layer 44, and the third molding layer 45 may include silicon oxide, silicon oxynitride, or polysilicon. For example, the first molding layer 43 may include BPSG, the second molding layer 44 may include TEOS, and the third molding layer 45 may include polysilicon. However, other suitable materials may be used for molding layers 43, 44, and 45 according to other example embodiments.

The first supporter 51 and the second supporter 61 may be formed of a material layer having an etch selectivity with respect to the first molding layer 43, the second molding layer 44, and the third molding layer 45. The first supporter 51 and the second supporter 61 may be formed from a material as described with reference to FIGS. 1, 2A, and 2B. For example, the first supporter 51 may include a first element, a second element, and oxygen (O). The second supporter 61 may include silicon nitride.

In other embodiments, the first supporter 51 and the second supporter 61 may be modified to have a configuration as described with reference to FIGS. 6A to 11G.

In certain embodiments, a heat treatment process such as a Spike-RTA process at 950° C. or a Flash-RTA process at 1200° C. may be performed after the formation of the first supporter 51 and the second supporter 61. Properties of the switching devices may be improved.

Figure 13:
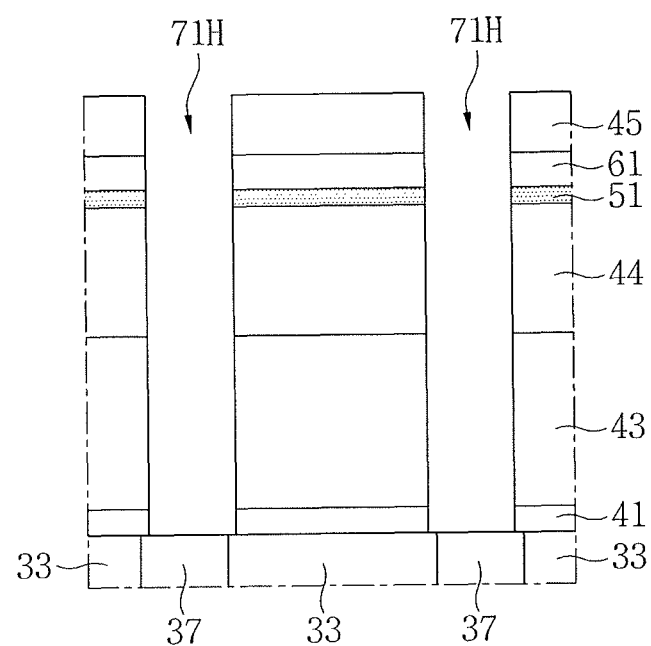

Referring to FIG. 13, electrode holes 71H passing through the third molding layer 45, the second supporter 61, the first supporter 51, the second molding layer 44, the first molding layer 43, and the etch-stop layer 41, and exposing the buried contact plugs 37, may be formed. The formation of the electrode holes 71H may include a patterning process. The first supporter 51 and the second supporter 61 may be exposed on sidewalls of the electrode holes 71H.

Figure 14:
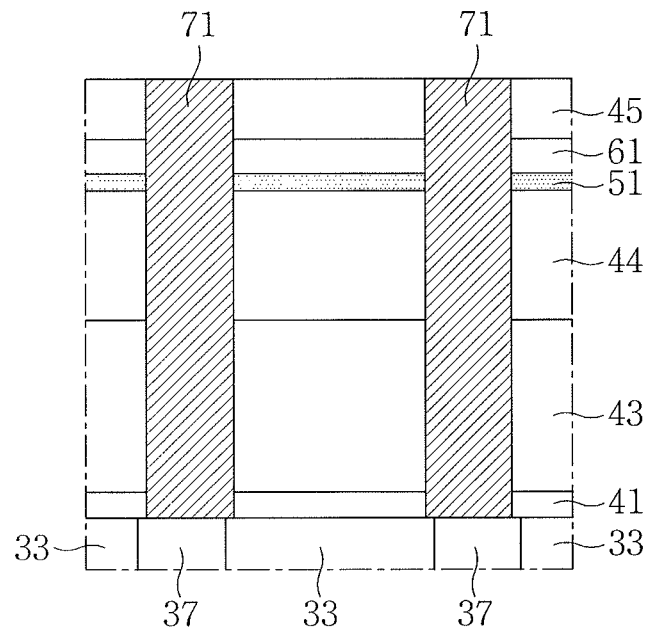

Referring to FIG. 14, lower electrodes 71 filling the electrode holes 71H may be formed. The lower electrodes 71 may be formed using a thin-film formation process and a planarization process. Upper surfaces of the lower electrodes 71 and third molding layer 45 may be exposed substantially on the same plane. The lower electrodes 71 may be in contact with the buried contact plugs 37. The lower electrodes 71 may be in contact with the etch-stop layer 41. The lower electrodes 71 may be in contact with the first supporter 51 and the second supporter 61.

The lower electrodes 71 may include a metal layer. The metal layer may include Ru, RuO, Pt, PtO, Ir, IrO, SrRuO (SRO), (Ba,Sr)RuO (BSRO), CaRuO (CRO), BaRuO, La(Sr, Co)O, Ti, TiN, W, WN, Ta, TaN, TiAlN, TiSiN, TaAlN, TaSiN, or a combination thereof. One or more metal layers may be provided in each of the lower electrodes. In an example embodiment, the lower electrodes 71 may include a Ru layer, a RuO layer, or a combination thereof. The first supporter 51 may have excellent adhesion to the lower electrodes 71.

Figure 15:
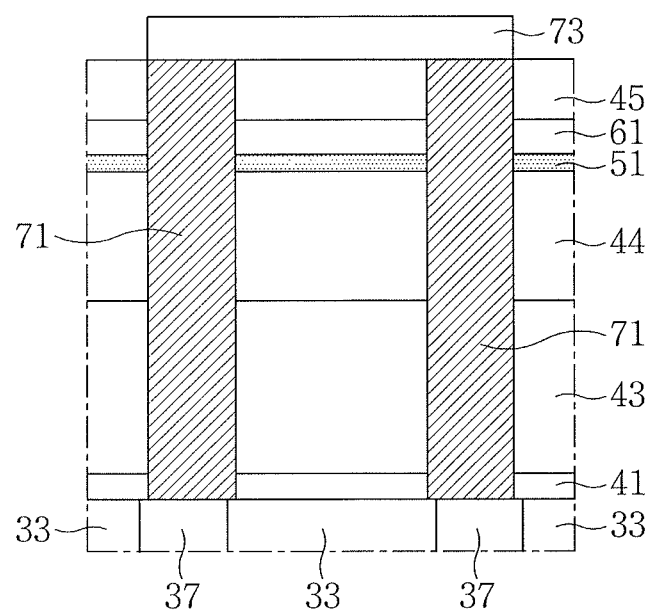

Referring to FIG. 15, a mask pattern 73 may be formed over the lower electrodes 71 and the third molding layer 45. The mask pattern 73 may partially expose an upper surface of the third molding layer 45.

Figure 16:
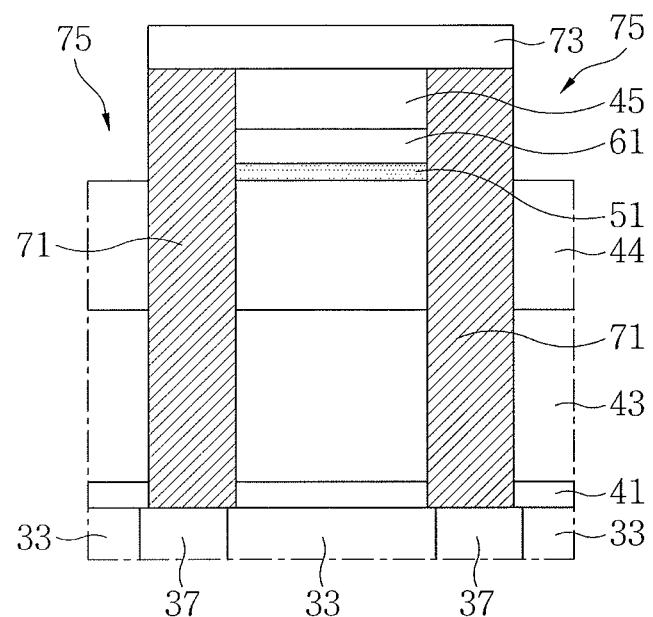

Referring to FIG. 16, first openings 75 passing through the third molding layer 45, the second supporter 61, and the first supporter 51 may be formed using the mask pattern 73 as an etch mask.

Figure 17:
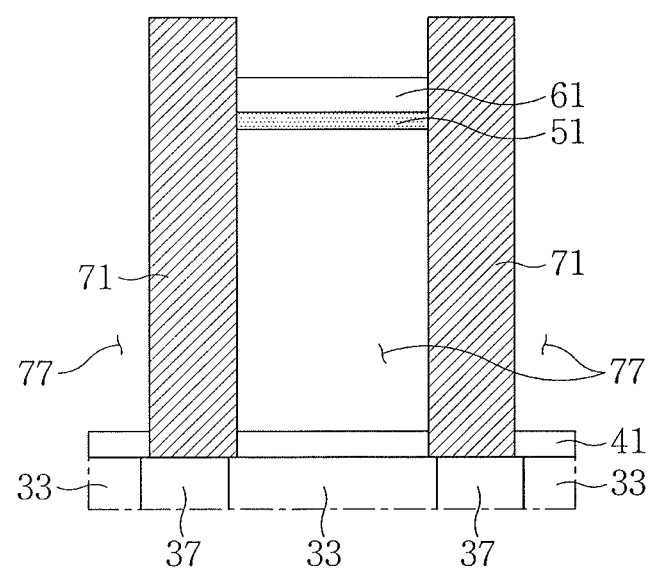

Referring to FIG. 17, the mask pattern 73, the third molding layer 45, the second molding layer 44, and the first molding layer 43 may be removed to expose the lower electrodes 71. An empty space 77 may be formed near the lower electrodes 71. For example, the empty space 77 may be located in between the lower electrodes 71, above and below the first and second supports 51 and 61. The empty space 77 may also be located on outer sides of the lower electrodes 71, as illustrated in FIG. 17. The second supporter 61 and the first supporter 51 may remain between the lower electrodes 71. The second supporter 61 and the first supporter 51 may help prevent the lower electrodes 71 from collapsing.

Figure 18:
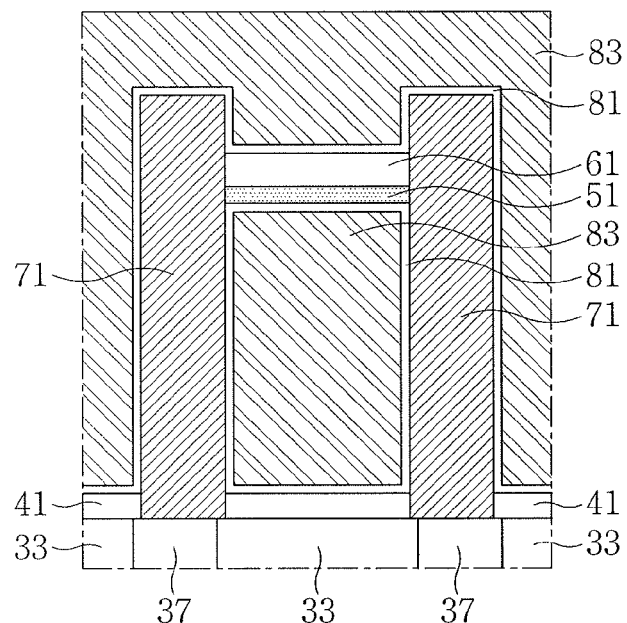

Referring to FIG. 18, a capacitor dielectric layer 81 may be formed so as to cover surfaces of the lower electrodes 71. The capacitor dielectric layer 81 may be uniformly formed over the surfaces of the lower electrodes 71. The capacitor dielectric layer 81 may cover an upper surface of the second supporter 61 and a lower surface of the first supporter 51. An upper electrode 83 may be formed on the capacitor dielectric layer 81. The upper electrode 83 may fully fill between the lower electrodes 71. The upper electrode 83 may surround an outer portion of the lower electrodes 71.

Figure 19:
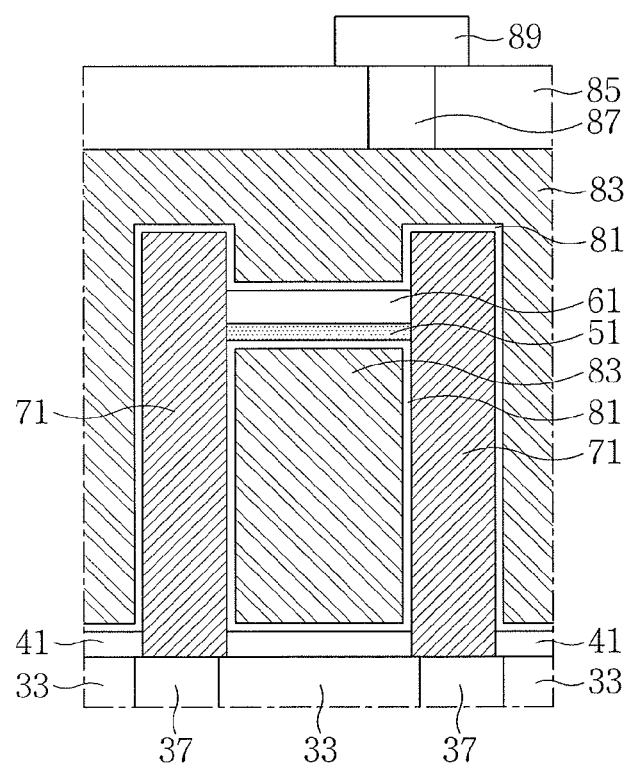

Referring to FIG. 19, an upper insulating layer 85 may be formed over the upper electrode 83. An upper plug 87, passing through the upper insulating layer 85 and connected to the upper electrode 83, may be formed. An upper interconnection 89 in contact with the upper plug 87 may be formed on the upper insulating layer 85.

FIGS. 20 to 28 illustrate cross-sectional views of a method of forming a semiconductor device in accordance with certain example embodiments.

Figure 20:
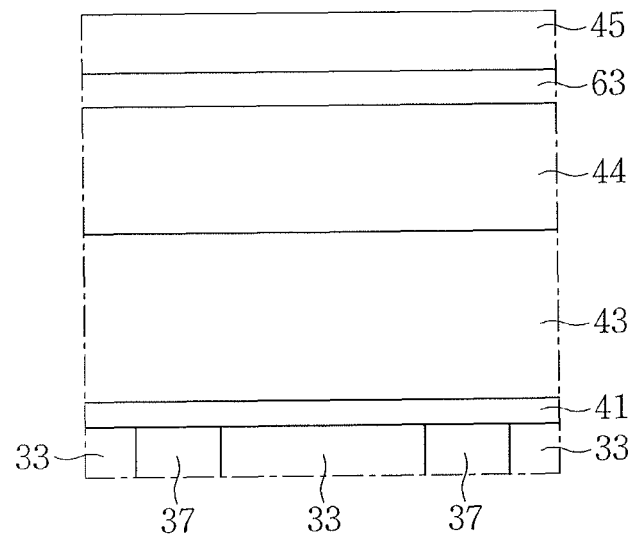

Referring to FIG. 20, an etch-stop layer 41 may be formed on buried contact plugs 37 and an interlayer insulating layer 33. A first molding layer 43, a second molding layer 44, a sixth supporter 63, and a third molding layer 45 may be sequentially formed on the etch-stop layer 41. The sixth supporter 63 may have a configuration as described with reference to FIG. 6E or 11E. The sixth supporter 63 may include silicon nitride, or any other material described herein with respect to sixth supporter 63 and/or second supporter 61.

Figure 21:
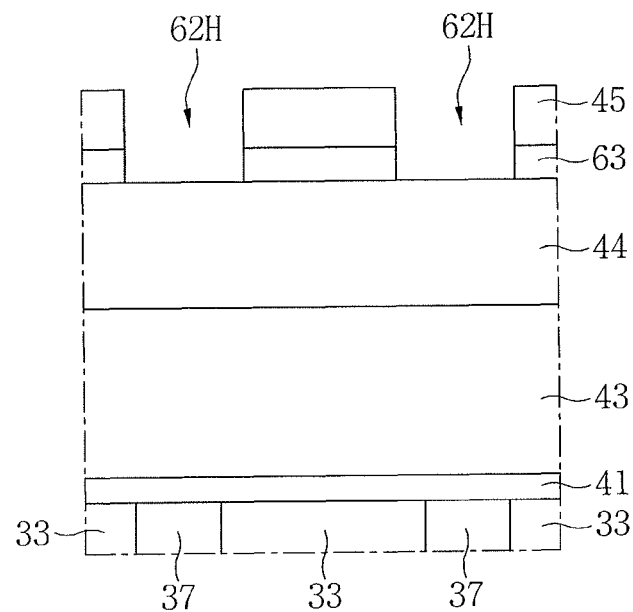

Referring to FIG. 21, upper holes 62H passing through the third molding layer 45 and sixth supporter 63 may be formed. The formation of the upper holes 62H may include a patterning process. The second molding layer 44 may be exposed on a bottom of the upper holes 62H, and the sixth supporter 63 may be exposed on sidewalls of the upper holes 62H.

Figure 22:
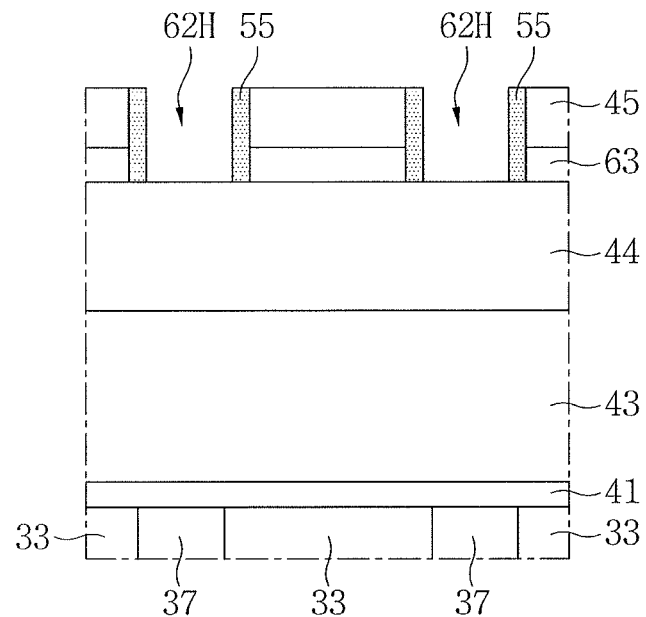

Referring to FIG. 22, seventh supporters 55 may be formed on the sidewalls of the upper holes 62H. The seventh supporters 55 may be formed using a thin-film formation process and an anisotropic etching process. The seventh supporters 55 may be in contact with the sixth supporter 63.

Figure 23:
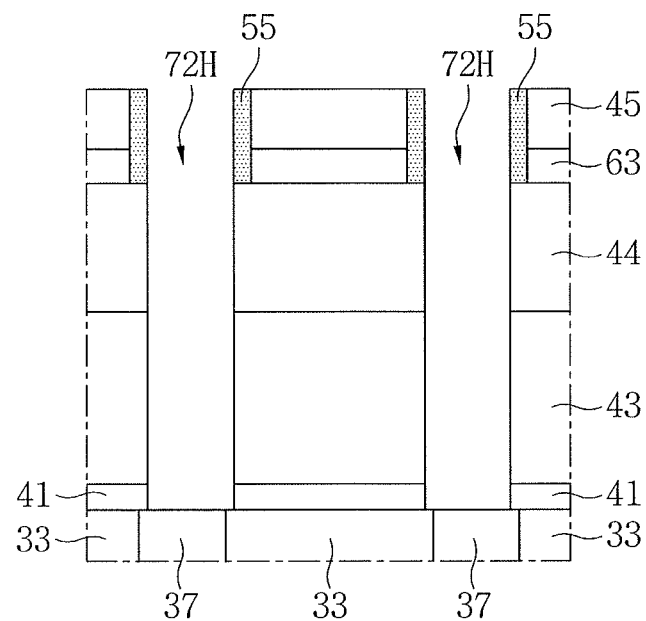

Referring to FIG. 23, electrode holes 72H passing through the second molding layer 44, the first molding layer 43, and the etch-stop layer 41, and exposing the buried contact plugs 37, may be formed using the third molding layer 45 and the seventh supporters 55 as an etch mask.

Figure 24:
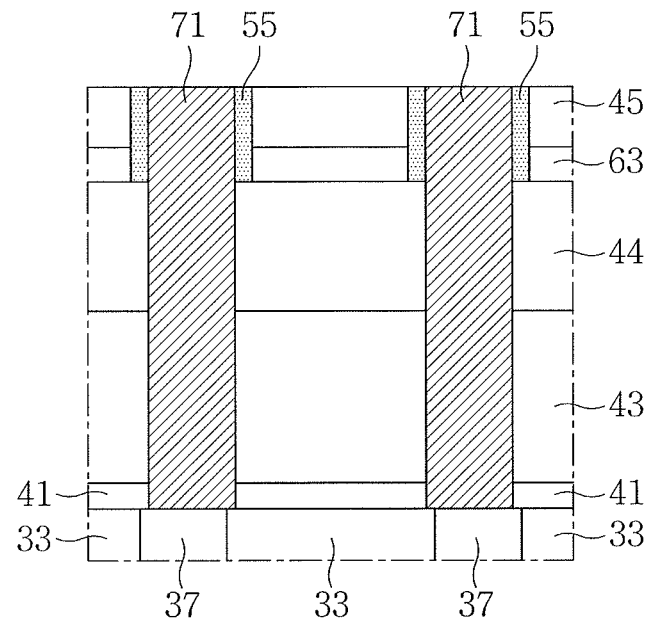

Referring to FIG. 24, lower electrodes 71 filling the electrode holes 72H may be formed. The lower electrodes 71 may be in contact with the seventh supporters 55. The lower electrodes 71 may be in contact with and/or connected to buried contact plugs 37 and an interlayer insulating layer 33. The lower electrodes 71 may contact etch-stop layer 41.

Figure 25:
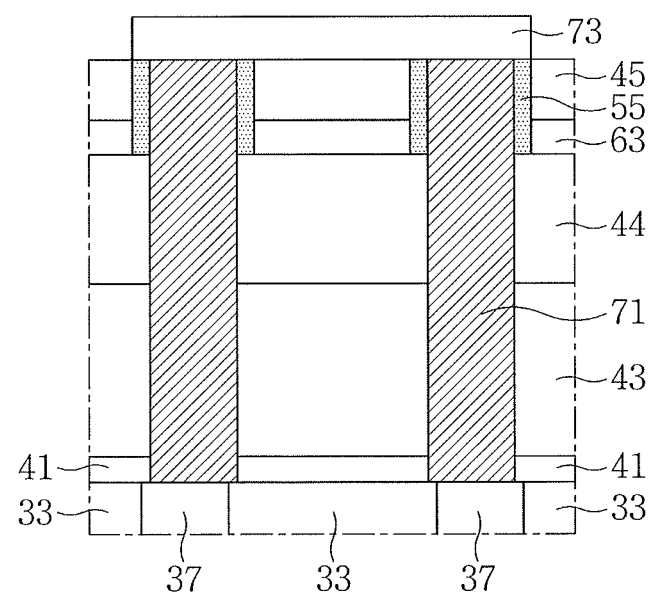

Referring to FIG. 25, a mask pattern 73 may be formed on the lower electrodes 71 and the third molding layer 45. The mask pattern 73 may partially expose an upper surface of the third molding layer 45.

Figure 26:
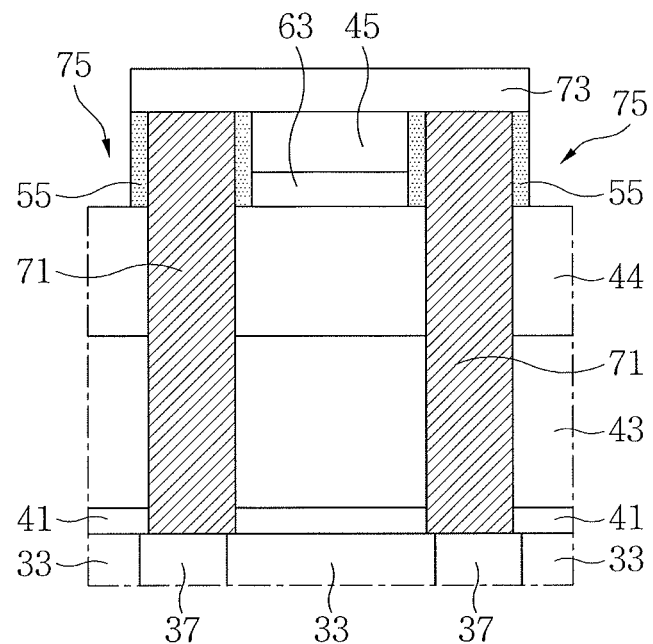

Referring to FIG. 26, first openings 75 passing through the third molding layer 45 and the sixth supporter 63 may be formed using the mask pattern 73 as an etch mask.

Figure 27:
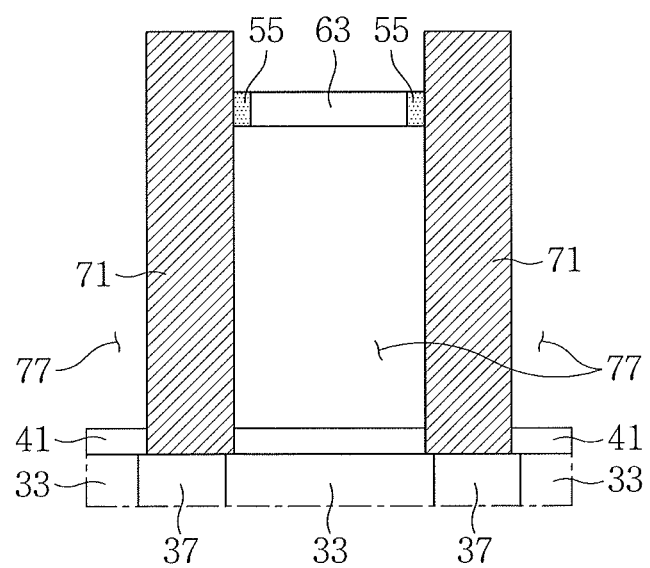

Referring to FIG. 27, the mask pattern 73, the third molding layer 45, the second molding layer 44, and the first molding layer 43 may be removed to expose the lower electrodes 71. An empty space 77 may be formed near the lower electrodes 71. For example, the empty space 77 may be located in between the lower electrodes 71, above and below the sixth supporter 63. The empty space 77 may also be located on outer sides of the lower electrodes 71, as illustrated in FIG. 27. The sixth supporter 63 and the seventh supporters 55 may remain between the lower electrodes 71. The sixth supporter 63 and the seventh supporters 55 may help prevent the lower electrodes 71 from collapsing.

Figure 28:
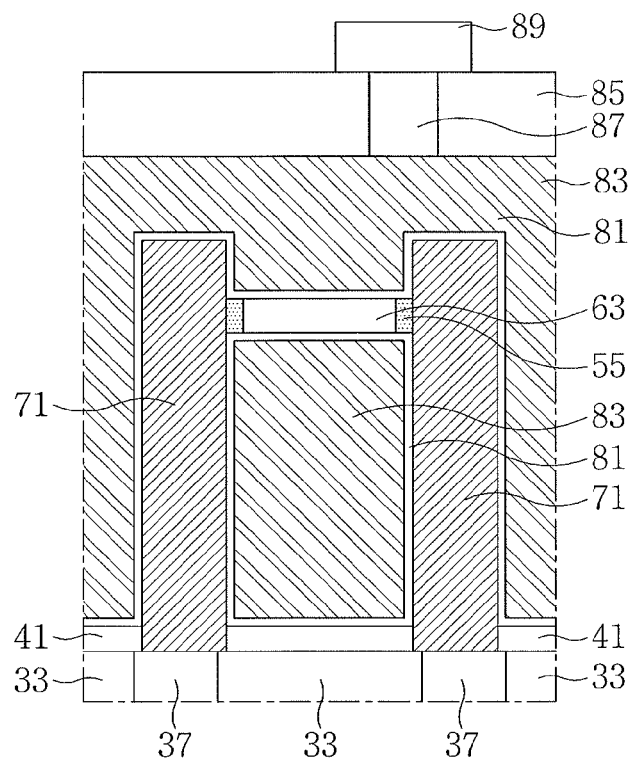

Referring to FIG. 28, a capacitor dielectric layer 81 may be formed so as to cover surfaces of the lower electrodes 71. The capacitor dielectric layer 81 may uniformly cover the surfaces of the lower electrodes 17. The capacitor dielectric layer 81 may cover the sixth supporter 63 and the seventh supporters 55. An upper electrode 83 may be formed on the capacitor dielectric layer 81. An upper insulating layer 85 may be formed on the upper electrode 83. An upper plug 87 passing through the upper insulating layer 85 and connected to the upper electrode 83 may be formed. An upper interconnection 89 in contact with the upper plug 87 may be formed on the upper insulating layer 85.

FIGS. 29 to 32 illustrate cross-sectional views of a method for forming a semiconductor device in accordance with certain example embodiments.

Figure 29:
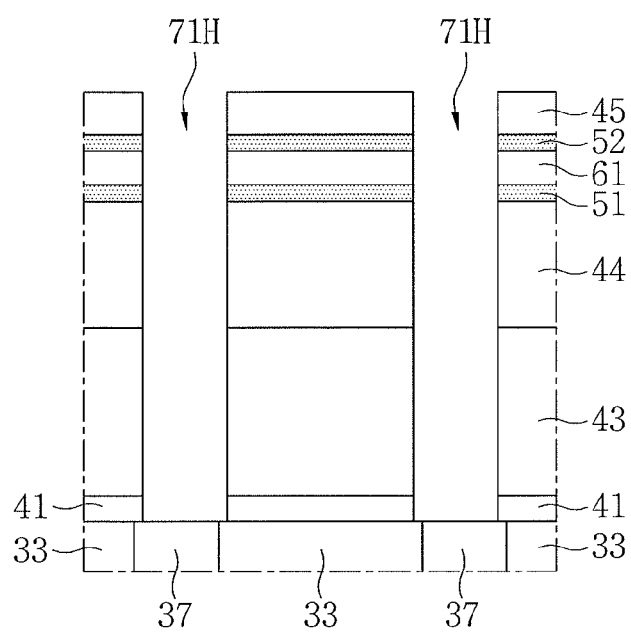

Referring to FIG. 29, an etch-stop layer 41 may be formed on buried contact plugs 37 and an interlayer insulating layer 33. A first molding layer 43, a second molding layer 44, a first supporter 51, a second supporter 61, a third supporter 52, and a third molding layer 45 may be sequentially formed on the etch-stop layer 41. Electrode holes 71H passing through the third molding layer 45, the third supporter 52, the second supporter 61, the first supporter 51, the second molding layer 44, the first molding layer 43, and the etch-stop layer 41, and exposing the buried contact plugs 37, may be formed. The third supporter 52, the second supporter 61, the first supporter 51, and the etch-stop layer 41 may be exposed on sidewalls of the electrode holes 71H.

Figure 30:
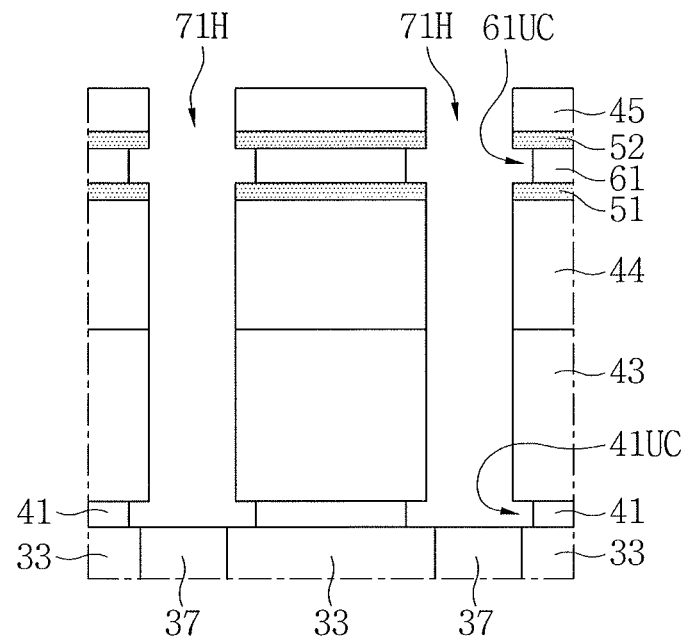

Referring to FIG. 30, the etch-stop layer 41 and the second supporter 61 may be isotropically etched to form first undercut areas 41UC and second undercut areas 61UC. The first undercut areas 41UC may be formed between the first molding layer 43 and the interlayer insulating layer 33, and the second undercut areas 61UC may be formed between the third supporter 52 and the first supporter 51.

Figure 31:
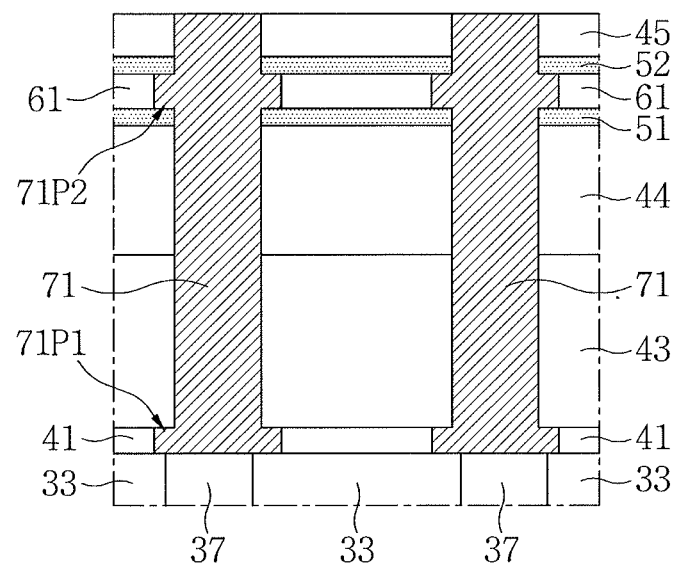

Referring to FIG. 31, lower electrodes 71 filling the electrode holes 71H may be formed. The lower electrodes 71 may include a first protrusion 71P1 and a second protrusion 71P2. The first protrusion 71P1 may be in contact with the etch-stop layer 41. The second protrusion 71P2 may extend between the first supporter 51 and the third supporter 52. The second protrusion 71P2 may be in contact with the first supporter 51, the second supporter 61, and the third supporter 52. Each of first and second protrusions 71P1 and 71P2 may extend beyond opposing lateral side surfaces of each lower electrode 71.

Figure 32:
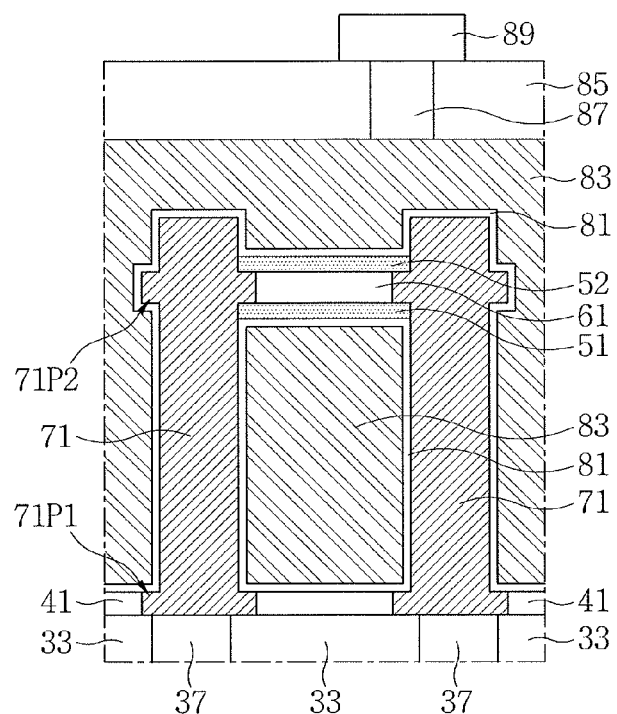

Referring to FIG. 32, a capacitor dielectric layer 81 may be formed over the electrodes 71. The capacitor dielectric layer 81 may cover the first supporter 51 and the third supporter 52. An upper electrode 83 may be formed over the capacitor dielectric layer 81. The upper electrode 83 may also be formed in between the lower electrodes 71, and around outer sides of the lower electrodes. An upper insulating layer 85 may be formed on the upper electrode 83. An upper plug 87 passing through the upper insulating layer 85 and connected to the upper electrode 83 may be formed. An upper interconnection 89 in contact with the upper plug 87 may be formed on the upper insulating layer 85.

The elements referred to in the FIGS. 12-32 embodiments may include the materials described with respect to the first and second supporters of the FIG. 1 embodiment.

Figure 33:
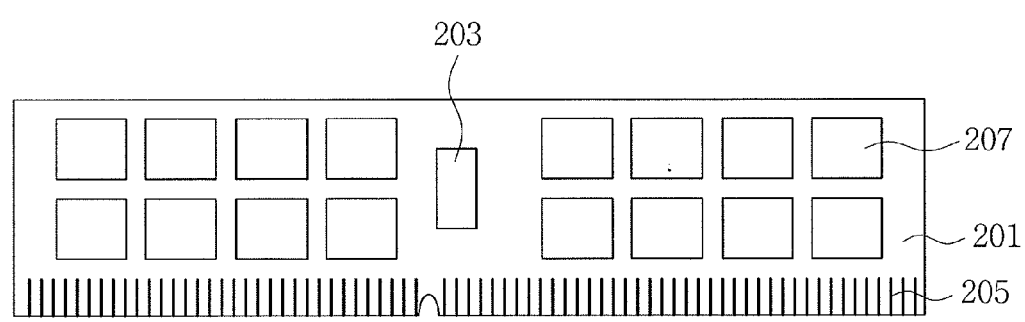
FIG. 33 illustrates an example layout of a semiconductor module according to an embodiment.

FIG. 33 illustrates a layout of a semiconductor module in accordance with certain example embodiments.

Referring to FIG. 33, the semiconductor module may include a module substrate 201, a plurality of semiconductor packages 207, and a control chip package 203. Input/output terminals 205 may be formed on the module substrate 201. At least one of the semiconductor packages 207 and control chip package 203 may have a configuration as described with respect to any of FIGS. 1 to 32. For example, the first supporter (reference number 51 in FIG. 1) and the second supporter (reference number 61 in FIG. 1) may be formed in the semiconductor packages 207 and/or the control chip package 203, and electrically connected to the input/output terminals 205. A semiconductor module including the first supporter 51 and the second supporter 61 may have improved electrical properties in certain example embodiments.

The semiconductor packages 207 and the control chip package 203 may be installed in the module substrate 201. The semiconductor packages 207 and the control chip package 203 may be electrically connected to the input/output terminals 205 in series/parallel.

The control chip package 203 may be omitted. The semiconductor packages 207 may include a volatile memory chip such as a dynamic random access memory (DRAM) and a static random access memory (SRAM), a non-volatile memory chip such as a flash memory, phase change memory, magnetic random access memory (MRAM), and resistive random access memory (RRAM), or a combination thereof. The semiconductor module in accordance with certain example embodiments may be a memory module.

Figure 34:
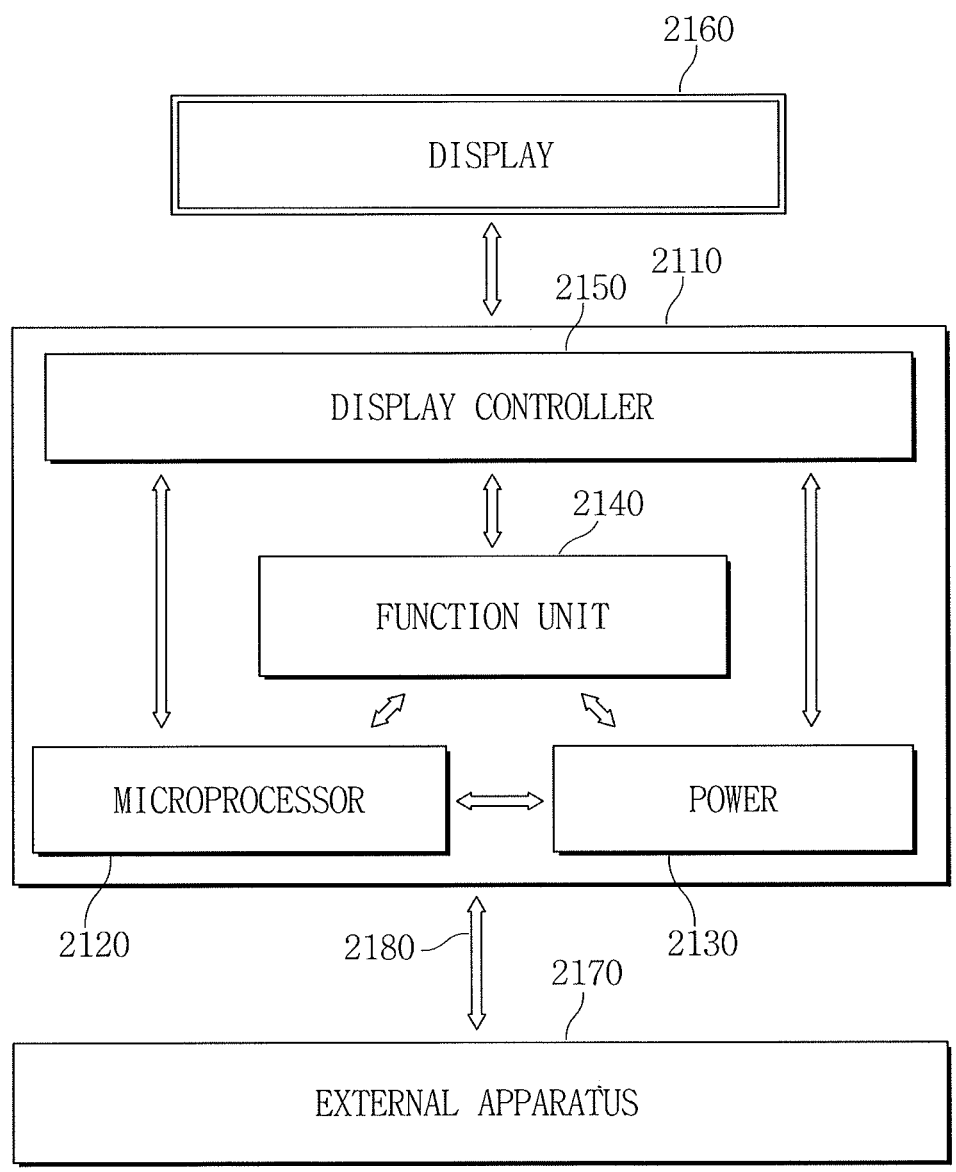
FIG. 34 illustrates a block diagram of an electronic apparatus according to certain example embodiments.

FIG. 34 illustrates a system block diagram showing an electronic apparatus in accordance with certain example embodiments.

Referring to FIG. 34, the semiconductor device as described with reference to FIGS. 1 to 32 may be applied to an electronic system 2100. The electronic system 2100 may include a body 2110, a microprocessor 2120, a power 2130, a function unit 2140, and a display controller 2150. The body 2110 may be a motherboard formed of a printed circuit board (PCB). The microprocessor 2120, the power 2130, the function unit 2140, and the display controller 2150 may be installed on the body 2110. A display 2160 may be arranged an inside or outside of the body 2110. For example, the display 2160 may be arranged on a surface of the body 2110 and display an image processed by the display controller 2150.

The power 2130 may receive a constant voltage from an external battery, etc., divide the voltage into various levels, and supply those voltages to the microprocessor 2120, the function unit 2140, and the display controller 2150, etc. The microprocessor 2120 may receive a voltage from the power 2130 to control the function unit 2140 and the display 2160. The function unit 2140 may perform various functions of the electronic system 2100. For example, when the electronic system 2100 is a mobile phone, the function unit 2140 may have several components which can perform functions of the mobile phone such as output of an image to the display 2160 or output of a voice to a speaker, by dialing or communication with an external apparatus 2170. If a camera is installed, the function unit 2140 may function as a camera image processor.

In certain example embodiments, when the electronic system 2100 is connected to a memory card or the like, in order to expand capacity, the function unit 2140 may be a memory card controller. The function unit 2140 may exchange signals with the external apparatus 2170 through a wired or wireless communication unit 2180. In addition, when the electronic system 2100 needs a universal serial bus (USB) or the like, in order to expand functionality, the function unit 2140 may function as an interface controller. Further, the function unit 2140 may include a mass storage apparatus.

The semiconductor device as described with reference to FIGS. 1 to 32 may be applied to the function unit 2140 or the microprocessor 2120. For example, the function unit 2140 may include the first supporter (reference number 51 in FIG. 1) and the second supporter (reference number 61 in FIG. 1). The function unit 2140 having at least one of the supporters described herein (e.g., first supporter 51 in FIG. 1, second supporter 61 in FIG. 1, or the like) may have improved electrical characteristics.

By way of summation and review, as the aspect ratio of electrodes is increased, the risk of electrode collapse during the fabrication of a semiconductor device also increases. As there is a growing trend toward producing semiconductor devices having electrodes with high aspect ratios, improved methods of preventing lower electrodes with a high aspect ratio from collapsing (e.g., during formation of a capacitor) may be desirable.

According to certain example embodiments, a supporter may be provided between lower electrodes. The supporter may include an amorphous metal oxide. The supporter may remain in the amorphous state even upon exposure to high temperatures during the semiconductor fabrication process. The amorphous metal oxide may have excellent adhesion to the lower electrodes. The supporter may help reduce or minimize leakage current, and may help prevent the lower electrodes from collapsing. A semiconductor device including one or more of the supporters described with respect to certain example embodiments may have improved electrical characteristics.

The provision of one or more supporters including an amorphous metal oxide and an element and/or oxide of the element capable of helping to reduce or prevent crystallization of the amorphous metal oxide during exposure to high temperatures, between two electrodes in a semiconductor device, may advantageously reduce leakage current between electrodes and may help prevent the electrodes from collapsing. The one or more supporters may further include a material with good insulating properties, which may help to further reduce or minimize leakage current. One or more of the materials included in the one or more supporters may adhere well to the electrodes. Semiconductor devices having electrodes with high aspect ratios and improved electrical properties may be formed. Certain example embodiments may provide a semiconductor device having a supporter which reduces or even suppresses leakage current, and which may help prevent lower electrodes from collapsing, and methods of fabricating the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a plurality of lower electrodes disposed on a substrate;
first and second supporters disposed between the lower electrodes;
an upper electrode disposed on the lower electrodes; and
a capacitor dielectric layer disposed between the lower electrodes and the upper electrode, wherein:
the first supporter includes a first element, a second element, and oxygen,
an oxide of the first element has better adhesion to the lower electrodes than the second supporter,
an oxide of the second element has a higher band gap energy than the oxide of the first element, and
the capacitor dielectric layer is in direct contact with the lower electrodes and the upper electrode.

2. The semiconductor device as claimed in claim 1, wherein the second supporter includes silicon nitride, the first element is Ta or Ti, and the second element is Si, Al, Mg, Be, or a combination thereof.

3. The semiconductor device as claimed in claim 1, wherein the first supporter includes first layers including the oxide of the first element and second layers including the oxide of the second element, the first and second layers being alternately and repeatedly stacked.

4. The semiconductor device as claimed in claim 3, wherein the first layers including the oxide of the first element have a thickness of from about 0.1 nm to 5 nm.

5. The semiconductor device as claimed in claim 1, wherein the first supporter is a layer including both the oxide of the first element and the oxide of the second element.

6. The semiconductor device as claimed in claim 1, wherein the first supporter is in contact with the lower electrodes, and an upper surface or lower surface of the second supporter.

7. The semiconductor device as claimed in claim 1, wherein the first supporter includes:
an upper supporter in contact with an upper surface of the second supporter; and
a lower supporter in contact with a lower surface of the second supporter.

8. The semiconductor device as claimed in claim 7, wherein the second supporter has a smaller horizontal width than the upper supporter and the lower supporter, and parts of the lower electrodes protrude between the upper supporter and the lower supporter.

9. The semiconductor device as claimed in claim 1, wherein the first supporter is formed between the lower electrodes and the second supporter, and is in contact with the lower electrodes and the second supporter.

10. The semiconductor device as claimed in claim 1, wherein the second supporter has a smaller horizontal width than the first supporter,
the first supporter is in contact with the lower electrodes, and
the second supporter is in contact with the first supporter and spaced apart from the lower electrodes.

11. The semiconductor device as claimed in claim 1, wherein the capacitor dielectric layer is in direct contact with the first supporter.

12. The semiconductor device as claimed in claim 1, wherein the capacitor dielectric layer is in direct contact with the second supporter.

13. A semiconductor device, comprising:
a plurality of lower electrodes having a vertical length greater than a horizontal width on a substrate;
a supporter disposed between the lower electrodes;
an upper electrode disposed on upper and lateral surfaces of the lower electrodes; and
a capacitor dielectric layer disposed between the lower electrodes and the upper electrode, wherein:
the supporter includes a first element, a second element, and oxygen,
an oxide of the second element has a higher band gap energy than an oxide of the first element, and
the content of the second element in the supporter is from about 10 at % to 90 at %.

14. The semiconductor device as claimed in claim 13, wherein the lower electrodes include Ru, RuO, or a combination thereof, the first element is Ta or Ti, and the second element is Si, Al, Mg, Be, or a combination thereof.

15. The semiconductor device as claimed in claim 13, wherein the first element is Ta, the second element is Si, and the content of the second element in the supporter is from about 10 at % to 20 at %.

16. The semiconductor device as claimed in claim 13, wherein the first element is Ta, the second element is Al, and the content of the second element in the supporter is from about 20 at % to 40 at %.

17. The semiconductor device as claimed in claim 13, wherein the oxide of the second element has a band gap energy of at least about 5.0 eV.

18. A semiconductor device, comprising:
a plurality of switching devices disposed on a substrate;
an interlayer insulating layer disposed on the switching devices;
conductive plugs passing through the interlayer insulating layer and connected to the switching devices;
an etch-stop layer disposed on the interlayer insulating layer and the conductive plugs;
a plurality of lower electrodes passing through the etch-stop layer and connected to the conductive plugs, and having a vertical length greater than a horizontal width;
first and second supporters disposed between the lower electrodes;
an upper electrode disposed on the lower electrodes; and
a capacitor dielectric layer disposed between the lower electrodes and the upper electrode, wherein:
the first supporter includes a first element, a second element, and oxygen,
an oxide of the first element has better adhesion to the lower electrodes than the second supporter, and
an oxide of the second element has a higher band gap energy than the oxide of the first element.

19. The semiconductor device as claimed in claim 18, wherein the conductive plugs include W, Ru, TiN, or a combination thereof.

20. The semiconductor device as claimed in claim 18, wherein:
the etch-stop layer includes a first etch-stop layer and a second etch-stop layer,
the first etch-stop layer includes a same material layer as the first supporter, and
the second etch-stop layer includes a same material layer as the second supporter.

21. The semiconductor device as claimed in claim 18, wherein each of the lower electrodes includes:
a first lower electrode with a pillar shape; and
a second lower electrode with a cylindrical shape formed on the first lower electrode.

22. A semiconductor device, comprising:
a plurality of lower electrodes having a vertical length greater than a horizontal width on a substrate;
first and second supporters disposed between the lower electrodes;
an upper electrode disposed on the lower electrodes; and
a capacitor dielectric layer disposed between the lower electrodes and the upper electrode,
wherein the first supporter includes an amorphous-state metal oxide having better adhesion to the lower electrodes than the second supporter,
and wherein the capacitor dielectric layer is in direct contact with the lower electrodes and the upper electrode.

23. The semiconductor device as claimed in claim 22, wherein at least one of the vertical length and the horizontal width is from about 0.1 nm to 5 nm.

24. The semiconductor device as claimed in claim 22, wherein:
the lower electrodes include Ru, RuO, or a combination thereof,
the amorphous-state metal oxide includes amorphous TaO, and
the second supporter includes silicon nitride.

25. The semiconductor device as claimed in claim 22, wherein the first supporter is in contact with an upper surface or lower surface of the second supporter.

26. The semiconductor device as claimed in claim 22, further comprising:
a third supporter disposed on the second supporter, wherein:
the second supporter is formed between the first supporter and the third supporter, and
the third supporter includes a same material as the first supporter and has a thickness of from about 0.1 nm to 5 nm.

* * * * *